United States Patent
Bharitkar

(10) Patent No.: US 10,841,726 B2
(45) Date of Patent: Nov. 17, 2020

(54) IMMERSIVE AUDIO RENDERING

(71) Applicant: Hewlett-Packard Development Company, L.P., Spring, TX (US)

(72) Inventor: Sunil Bharitkar, Palo Alto, CA (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/487,882

(22) PCT Filed: Apr. 28, 2017

(86) PCT No.: PCT/US2017/030225
§ 371 (c)(1),
(2) Date: Aug. 22, 2019

(87) PCT Pub. No.: WO2018/200000
PCT Pub. Date: Nov. 1, 2018

(65) Prior Publication Data
US 2020/0236488 A1   Jul. 23, 2020

(51) Int. Cl.
*H04S 7/00* (2006.01)
*H04R 3/04* (2006.01)
(Continued)

(52) U.S. Cl.
CPC .............. *H04S 7/304* (2013.01); *H04R 3/04* (2013.01); *H04R 3/12* (2013.01); *H04R 5/033* (2013.01);
(Continued)

(58) Field of Classification Search
CPC .. H04S 7/304; H04S 2400/01; H04S 2400/03; H04S 2400/07; H04S 2400/00;
(Continued)

(56) References Cited

U.S. PATENT DOCUMENTS 9,088,858 B2   7/2015   Kraemer et al.
9,398,394 B2   7/2016   Bongiovi et al.
(Continued)

FOREIGN PATENT DOCUMENTS

WO   WO-1998056210 A1   12/1998

OTHER PUBLICATIONS

ATC Labs: Immersive Soundfield Rendition (ISR)—Low Bit Rate Multichannel Audio Codec < http://www.atc-labs.com/products/isr/isr.html >.

*Primary Examiner* — Jason R Kurr
(74) *Attorney, Agent, or Firm* — Mannava & Kang

(57) ABSTRACT

In some examples, immersive audio rendering may include determining whether an audio signal includes a first content format including stereo content, or a second content format including multichannel or object-based content. In response to a determination that the audio signal includes the first content format, the audio signal may be routed to a first block that includes a low-frequency extension and a stereo to multichannel upmix to generate a resulting audio signal. Alternatively, the audio signal may be routed to another low-frequency extension to generate the resulting audio signal. The audio signal may be further processed by performing spatial synthesis on the resulting audio signal, and crosstalk cancellation on the spatial synthesized audio signal. Further, multiband-range compression may be performed on the crosstalk cancelled audio signal, and an output stereo signal may be generated based on the multiband-range compressed audio signal.

15 Claims, 31 Drawing Sheets

(51) Int. Cl.
    *H04R 3/12*      (2006.01)
    *H04R 5/033*     (2006.01)
    *H04R 5/04*      (2006.01)

(52) U.S. Cl.
    CPC ............ *H04R 5/04* (2013.01); *H04S 2400/01*
                       (2013.01); *H04S 2420/01* (2013.01)

(58) Field of Classification Search
    CPC ...... H04S 2420/01; H04S 1/005; H04S 3/004;
              H04R 3/04; H04R 3/12; H04R 5/033;
                                              H04R 5/04
    See application file for complete search history.

(56)            References Cited

U.S. PATENT DOCUMENTS

2007/0223749 A1*   9/2007  Kim .................. H04R 5/02
                                                      381/309
2007/0223750 A1*   9/2007  Bai .................. H04S 1/002
                                                      381/309
2008/0031462 A1    2/2008  Walsh et al.
2008/0059155 A1    3/2008  Iser et al.
2013/0182853 A1    7/2013  Chang et al.
2016/0050508 A1    2/2016  Redmann
2016/0134988 A1    5/2016  Gorzel et al.

* cited by examiner

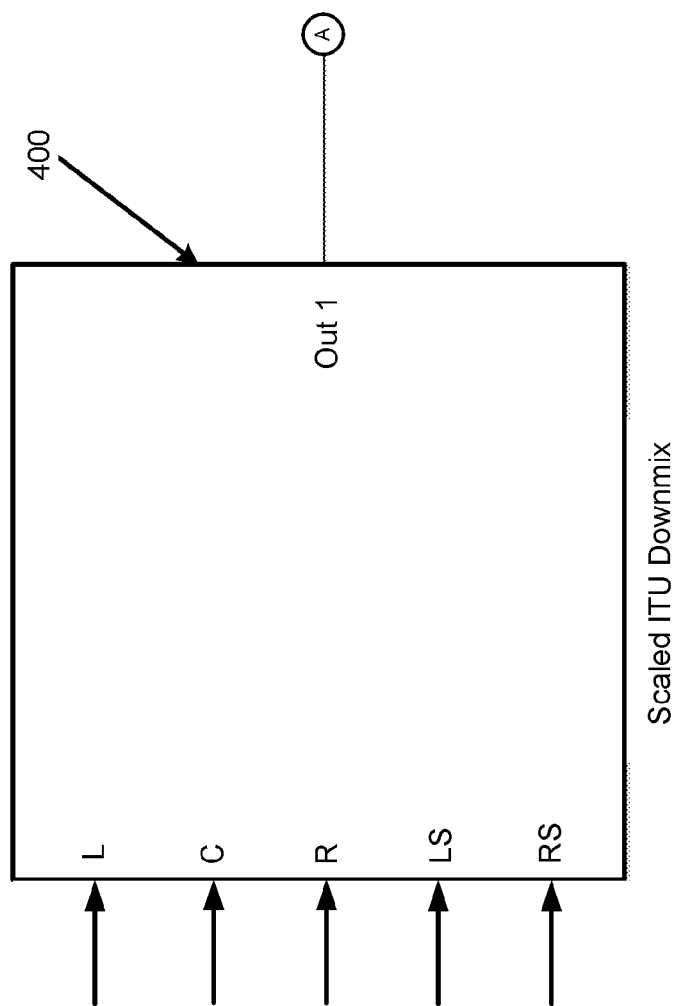

IMMERSIVE AUDIO RENDERING

BACKGROUND

Devices such as notebooks, desktop computers, mobile telephones, tablets, and other such devices may include speakers or utilize headphones to reproduce sound. The sound emitted from such devices may be subject to various processes that modify the sound quality.

BRIEF DESCRIPTION OF DRAWINGS

Features of the present disclosure are illustrated by way of example and not limited in the following figure(s), in which like numerals indicate like elements, in which.

DETAILED DESCRIPTION

Figure 1:
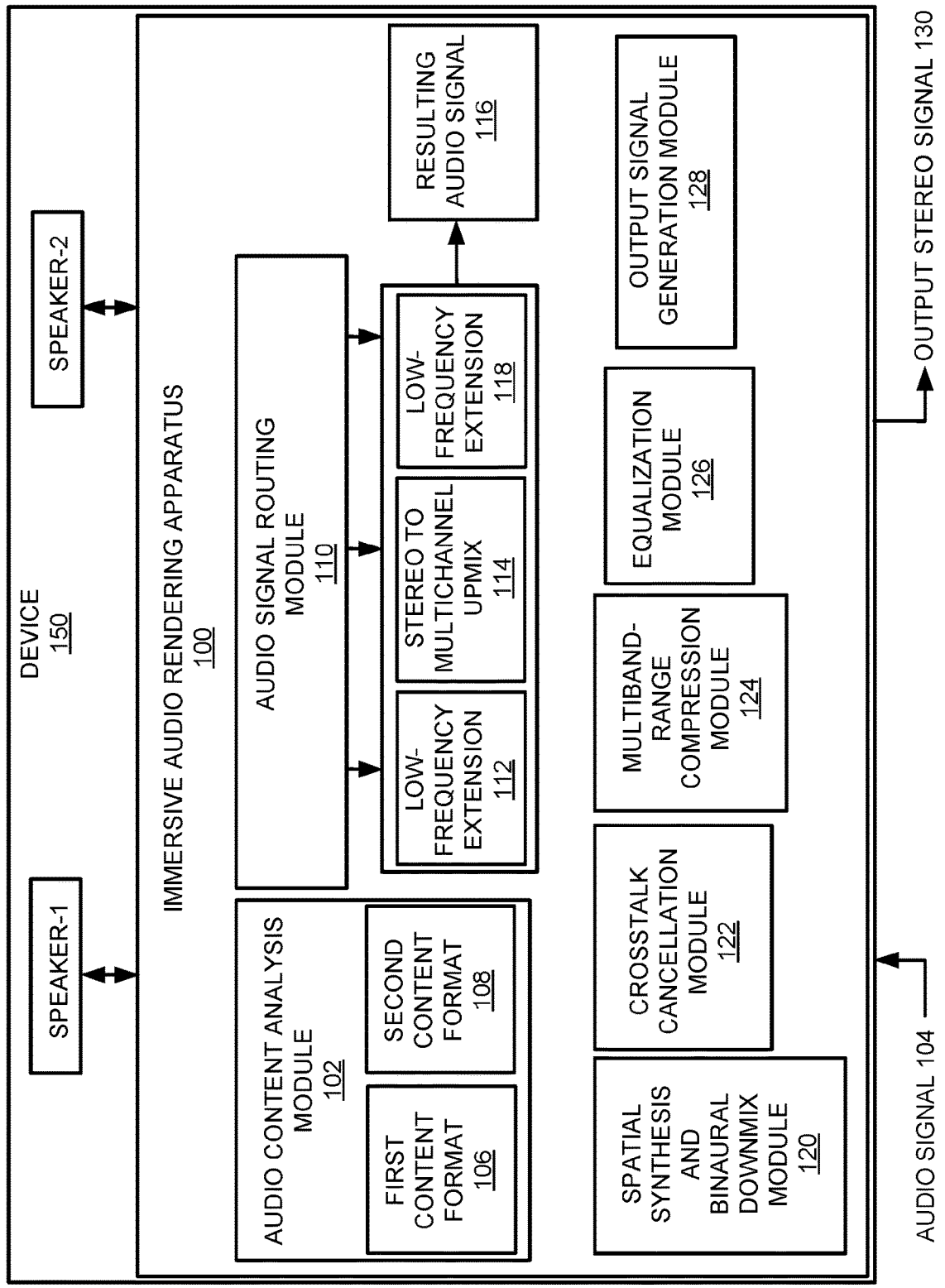
FIG. 1 illustrates an example layout of an immersive audio rendering apparatus.

For simplicity and illustrative purposes, the present disclosure is described by referring mainly to examples. In the following description, numerous specific details are set forth in order to provide a thorough understanding of the present disclosure. It will be readily apparent however, that the present disclosure may be practiced without limitation to these specific details. In other instances, some methods and structures have not been described in detail so as to not unnecessarily obscure the present disclosure.

Throughout the present disclosure, the terms "a" and "an" are intended to denote at least one of a particular element. As used herein, the term "includes" means includes but not limited to, the term "including" means including but not limited to. The term "based on" means based at least in part on.

Immersive audio rendering apparatuses, methods for immersive audio rendering, and non-transitory computer readable media having stored thereon machine readable instructions to provide immersive audio rendering are disclosed herein. The apparatuses, methods, and non-transitory computer readable media disclosed herein provide for creation of an immersive sound field from loudspeakers on personal devices and from headphones connected the personal devices. The devices may include, for example, notebooks, desktop computers, mobile telephones, tablets, and other such devices which include loudspeakers or utilize headphones to reproduce sound.

With respect to spatial rendering of audio signals, personal devices such as notebooks, desktop computers, mobile telephones, tablets, and other such devices may utilize a high-quality audio reproduction to create an immersive experience for cinematic and music content. The cinematic content may be multichannel (e.g., 5.1, 7.1, etc., where 5.1 represents "five point one" and includes a six channel surround sound audio system, 7.1 represents "seven point one" and includes an eight channel surround sound audio system, etc.). Elements that contribute towards a high-quality audio experience may include the frequency response (e.g., bass extension) of speakers or drivers, and proper equalization to attain a desired spectral balance. Other elements that contribute towards a high-quality audio experience may include artifact-free loudness processing to accentuate masked signals and improve loudness, and spatial quality that reflects artistic intent for stereo music and multichannel cinematic content.

With respect to rendering audio over loudspeakers or headphones, such rendering benefits from high-quality spatial rendering of an audio signal in order to increase immersiveness and engagement with the content. These aspects may be particularly applicable to cinematic content, which may include multichannel (5.1 or 7.1) content. However, the aspects of immersiveness and engagement with the content are technically challenging to achieve. For example, immersiveness and engagement with the content may be degraded due to inadequate frequency response (e.g., bass extension) of speakers or drivers, improper equalization to attain a desired spectral balance, artifacts in loudness processing, low spatial quality, etc.

In order to address at least these technical challenges associated with immersiveness and engagement with the content, the apparatuses, methods, and non-transitory computer readable media disclosed herein provide immersive audio rendering based on implementation of a combination of signal processing blocks in the audio playback chain to ensure that an immersive audio experience is perceived for arbitrary content. The apparatuses, methods, and non-transitory computer readable media disclosed herein provide for multichannel audio content (e.g., cinematic, streaming, sports), as well as stereo content (e.g., music or music videos).

The apparatuses, methods, and non-transitory computer readable media disclosed herein provide for routing of speech, music, and/or cinematic content via appropriate processing to either loudspeakers or headphones. The various parameters that control the processing (e.g. delays and mix-gains) may be exposed in a graphical user interface to control spatiality and timbre. The immersive audio rendering model disclosed herein may be scaled for object-based audio, and may include parameters for controlling and synthesizing head-related transfer functions (HRTFs). In this regard, an HRTF may be described as a response that characterizes how an ear receives a sound from a point in space. The HRTFs and reflection parameters may be updated in real-time based on accelerometer input to generate stationary virtual sources that are independent of head movements. In this regard, a direct sound may be described as sound that is received directly from a sound source, such as a speaker. A reflection may be described as sound that is reflected from a source (e.g., a wall), based on direct sound emitted from a sound source, such as a speaker.

According to an example, the disclosed immersive audio rendering may include determination of whether an audio signal includes a first content format including stereo content, or a second content format including multichannel or object-based content. In response to a determination that the audio signal includes the first content format, the audio signal may be routed to a first block that includes a low-frequency extension and a stereo to multichannel upmix to generate a resulting audio signal. Alternatively, in response to a determination that the audio signal includes the second content format, the audio signal may be routed to another low-frequency extension to generate the resulting audio signal. The audio signal may be further processed by performing spatial synthesis on the resulting audio signal. Crosstalk cancellation may be performed on the spatial synthesized audio signal. Further, multiband-range compression may be performed on the crosstalk cancelled audio signal. An output stereo signal may be generated based on the multiband-range compressed audio signal, where the output stereo signal provides immersive audio rendering to a user.

For the apparatuses, methods, and non-transitory computer readable media disclosed herein, modules, as described herein, may be any combination of hardware and programming to implement the functionalities of the respective modules. In some examples described herein, the combinations of hardware and programming may be implemented in a number of different ways. For example, the programming for the modules may be processor executable instructions stored on a non-transitory machine-readable storage medium and the hardware for the modules may include a processing resource to execute those instructions. In these examples, a computing device implementing such modules may include the machine-readable storage medium storing the instructions and the processing resource to execute the instructions, or the machine-readable storage medium may be separately stored and accessible by the computing device and the processing resource. In some examples, some modules may be implemented in circuitry.

FIG. 1 illustrates an example layout of an immersive audio rendering apparatus (hereinafter also referred to as "apparatus 100").

In some examples, the apparatus 100 may include or be provided as a component of a device such as a notebook, a desktop computer, a mobile telephone, a tablet, and other such devices. For the example of FIG. 1, the apparatus 100 is illustrated as being provided as a component of a device 150, which may include a notebook, a desktop computer, a mobile telephone, a tablet, and other such devices.

Referring to FIG. 1, the apparatus 100 may include an audio content analysis module 102 to determine whether an audio signal 104 includes a first content format 106 including stereo content, or a second content format 108 including multichannel or object-based content. In this regard, the audio content analysis module 102 may analyze the audio signal 104 to determine various preset parameters, such as music preset parameters, cinematic preset parameters, and speech preset parameters. These parameters may be applied to an output stereo signal as disclosed herein.

In response to a determination that the audio signal 104 includes the first content format 106, an audio signal routing module 110 is to route the audio signal 104 to a low-frequency extension 112 and a stereo to multichannel upmix 114 to generate a resulting audio signal 116.

Alternatively, in response to a determination that the audio signal 104 includes the second content format 108, the audio signal routing module 110 is to route the audio signal 104 to another low-frequency extension 118 to generate the resulting audio signal 116. In this regard, the audio signal 104 may include a plurality of content formats, such as, movie, music, voice, etc., and these content formats may be extended to genre-action, comedy, television show, etc.

A spatial synthesis and binaural downmix module 120 is to perform spatial synthesis on the resulting audio signal 116.

A crosstalk cancellation module 122 is to perform crosstalk cancellation on the spatial synthesized audio signal.

A multiband-range compression module 124 is to perform multiband-range compression on the crosstalk cancelled audio signal.

An equalization module 126 is to perform music, speech, or cinematic preset equalization on the multiband-range compressed audio signal. In this regard, the equalization module 126 may apply preset equalization parameters to the multiband-range compressed audio signal.

An output signal generation module 128 is to generate an output stereo signal 130 based on the multiband-range compressed audio signal.

Figure 2:
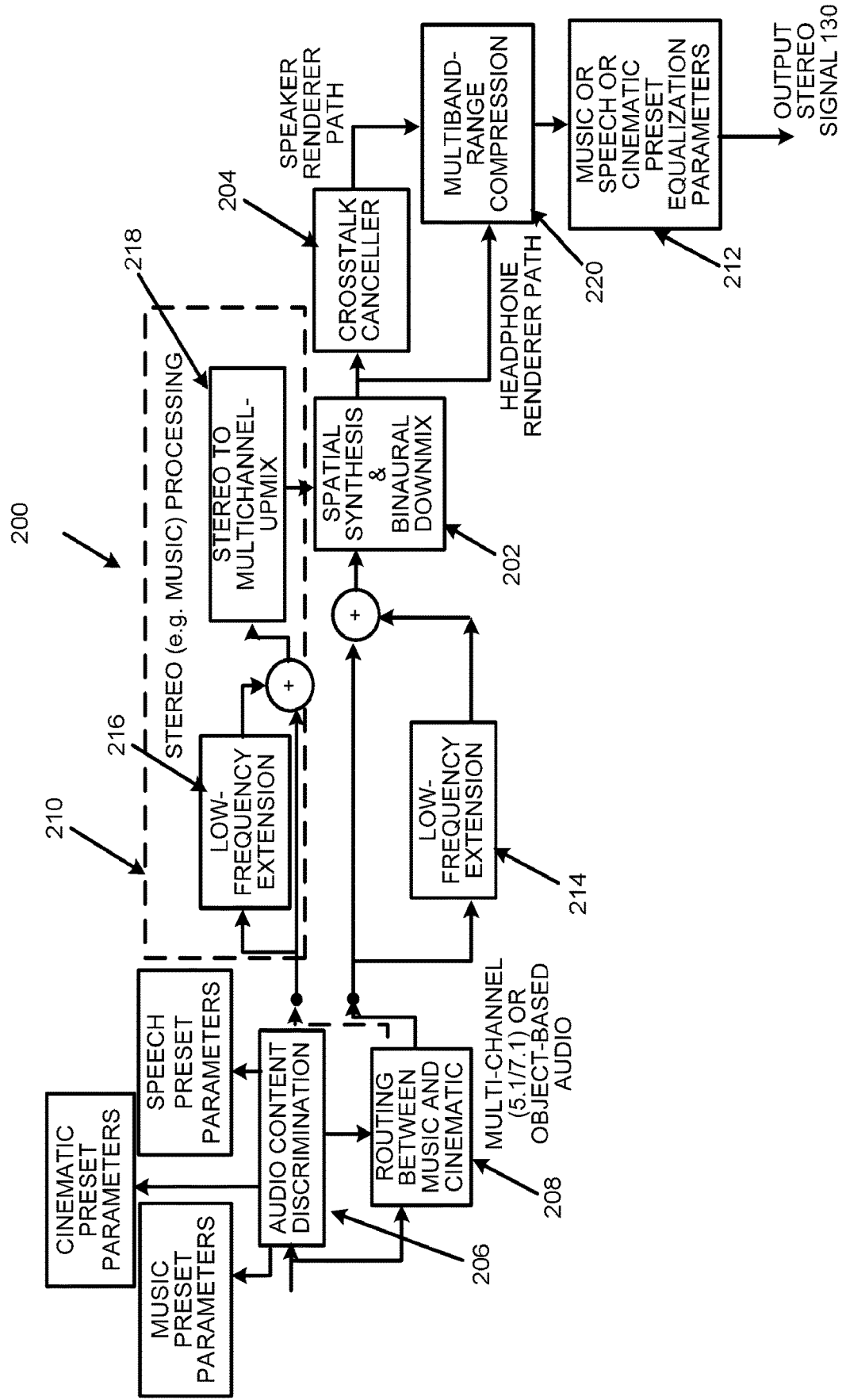
FIG. 2 illustrates an example logic flow of immersive audio rendering for the immersive audio rendering apparatus of FIG. 1.

FIG. 2 illustrates an example logic flow of immersive audio rendering 200 for the apparatus 100.

Referring to FIG. 2, the immersive audio rendering 200 may provide for integration in consumer, commercial and mobility devices, in the context of multichannel content (e.g., cinematic content). For example, the immersive audio rendering 200 may be integrated in a device such as a notebook, a desktop computer, a mobile telephone, a tablet, and other such devices.

The immersive audio rendering 200 may be extended to accommodate next-generation audio formats (including channel/objects or pure object-based signals and metadata) as input to the immersive audio rendering 200.

For the immersive audio rendering 200, reflections and desired direction sounds may be mixed in prior to crosstalk cancellation at the spatial synthesis and binaural downmix block at 202. For example, the spatial synthesis and binaural downmix 202, as implemented by the spatial synthesis and binaural downmix module 120, may apply HRTFs to render virtual sources at desired angles (and distances). According to an example, the HRTFs may be for angles +40° for the front left and front right sources (channels), 0° for the center, and +110° degrees for the left and right surround sources (channels).

For the immersive audio rendering 200, the crosstalk canceller block at 204, as implemented by the crosstalk cancellation module 122, will be described in further detail with reference to FIG. 3.

For the immersive audio rendering 200, the audio content discrimination block at 206, as implemented by the audio content analysis module 102, may provide for discrimination between stereo and multichannel content in order to deliver the appropriate content to the appropriate processing blocks. The output of the audio content discrimination block at 206, when identified as stereo (e.g., music), may be routed by block 208, as implemented by the audio signal routing module 110, to the processing elements in the dotted box at 210 as stereo music processing. Alternatively, the output, when identified as multichannel or object-based content, may be routed to the multichannel processing blocks (e.g., blocks outside of the dotted box at 210). Furthermore, appropriate presets may be loaded from memory and applied at the output stage at 212 (e.g., as implemented by the equalization module 126) as equalization or spatial settings for the processing depending on the type of content (e.g., music, speech, cinematic, etc.) and the type of device-centric rendering (e.g., loudspeakers, headphones, etc., where for headphones, a database of headphone filters may be pre-loaded and subsequently retrieved from memory).

The low-frequency extension block at 214 (e.g., the low-frequency extension 112 of FIG. 1), and similarly at 216 (e.g., the low-frequency extension 118 of FIG. 1) may perform psychoacoustically motivated low-frequency extension (for speakers or drivers incapable of reproducing low-frequencies due to their size) by ascertaining the loudspeaker characteristics and the analysis of signal spectrum. The output of the low-frequency extension block at 214 may be adapted to filter non-linearly synthesized harmonics. The low-frequency extension block at 214 may perform a synthesis of non-linear terms of a low pass audio signal in a side chain. Specifically auditory motivated filterbanks filter an audio signal, the peak of the audio signal may be tracked in each filterbank, and the maximum peak over all peaks or each of the peaks may be selected for non-linear term generation. The non-linear terms for each filterbank output may then be band pass filtered and summed into each of the channels to create the perception of low frequencies.

Prior to performing spatial rendering of music, the stereo-to-multichannel upmix block at 218 (e.g., the stereo to multichannel upmix 114 of FIG. 1) may perform a stereo upmix. With respect to the stereo-to-multichannel upmix block at 218, the stereo-to-multichannel upmix block at 218 may include a matrix of static coefficients, dynamic coefficients, or dynamic filters depending on the correlation of the content between the stereo channels in a given frame of audio signal. The audio signal frame may include samples of audio signal from the content.

The multiband-range compression block at 220 may perform multiband compression, for example, by using perfect reconstruction (PR) filterbanks, an International Telecommunication Union (ITU) loudness model, and a neural network to generalize to arbitrary multiband dynamic range compression (DRC) parameter settings.

With respect to the multiband-range compression block at 220, multiband range compression may be performed using perfect reconstruction filterbanks, implementation of standards, such as the ITU-R BS.1770 standard for loudness estimation, and neural-network trained parameters to control loudness and thus audio quality (e.g., timbre). For example, multiband range compression may include determining, based on variations in compression parameters that include compression thresholds ($\theta$s) and compression ratios (CRs), corresponding variations in loudness levels for a specified loudness standard. For example, the specified loudness standard may include the ITU-R BS.1770 standard for loudness. A learning model (e.g., a neural network) may be trained based on the variations in the compression parameters and the corresponding variations in the loudness levels. A specified loudness level may be ascertained for a device, such as the device 150.

Multiband range compression may include determining, based on the trained learning model, the compression parameters for the specified loudness level. In this regard, the trained learning model may be used to determine, for example, the compression parameters (e.g., $\theta$ and CR) for the specified loudness level.

Multiband range compression may include performing, based on the determined compression parameters, sub-band compression of an input audio signal (e.g., the signal received by block 220) by processing the input audio signal using a perfect reconstruction filterbank. An output audio signal (e.g., the signal generated by block 220) may be generated based on the performance of the sub-band compression of the input audio signal. The output audio signal may be applied to another device, or to the device 150 to generate the specified loudness level.

According to an example, with respect to multiband range compression, the perfect reconstruction filterbank may include a two-channel perfect reconstruction filterbank, and the two-channel perfect reconstruction filterbank divides a band associated with the input audio signal in approximately one-half.

According to an example, with respect to multiband range compression, the perfect reconstruction filterbank may include a four-channel nested perfect reconstruction filterbank, and the four-channel nested perfect reconstruction filterbank divides a band associated with the input audio signal in approximately four bands.

According to an example, with respect to multiband range compression, the sub-band compression of the input audio signal may be performed by applying a first predetermined gain value to a corresponding band of the input audio signal as a function of a compression threshold and a knee-width of the determined compression parameters for a first specified duration of the input audio signal. Further, the sub-band compression of the input audio signal may be performed by applying a second predetermined gain value to the corresponding band of the input audio signal as a function of the compression threshold, a compression ratio of the determined compression parameters, and the knee-width for a second specified duration of the input audio signal.

Figure 3:
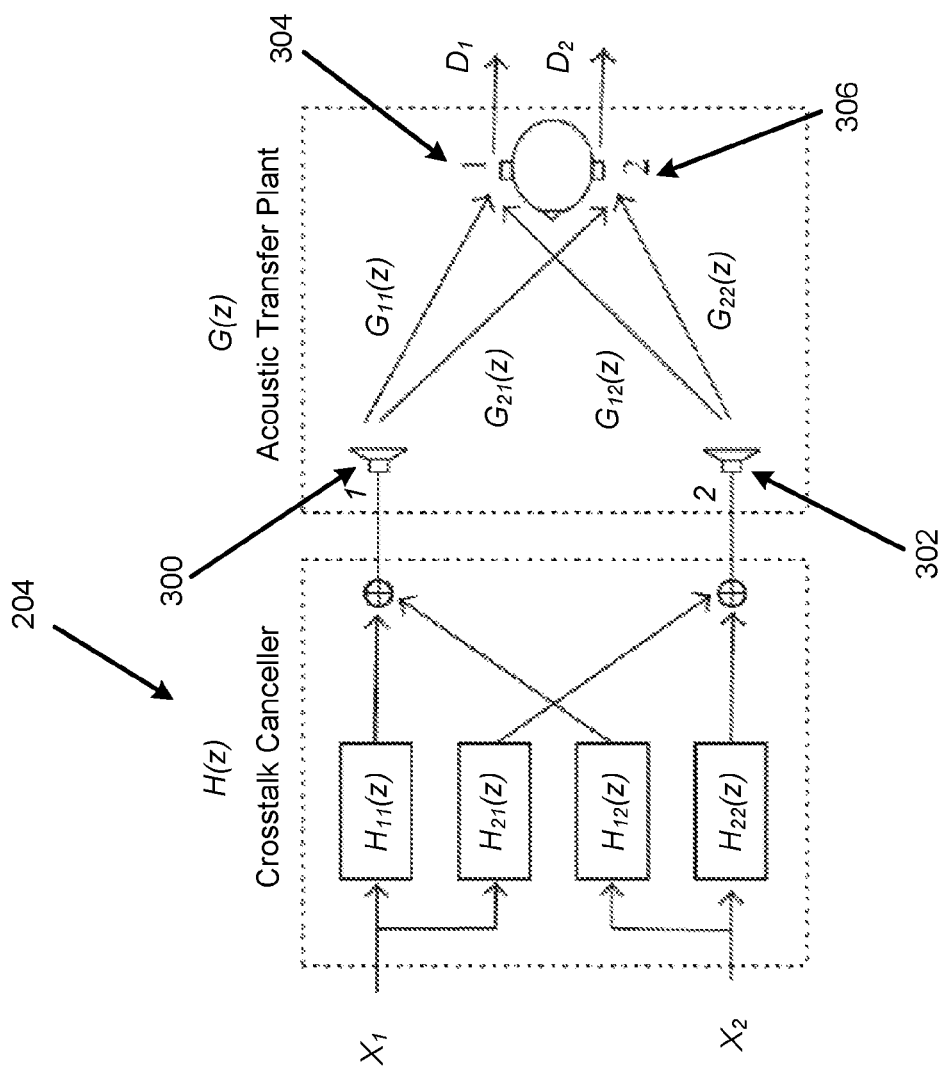
FIG. 3 illustrates an example layout of a crosstalk canceller and a binaural acoustic transfer function.

FIG. 3 illustrates an example layout of the crosstalk canceller 204 and a binaural acoustic transfer function.

The crosstalk canceler 204 may be used to perform equalization of the ipsilateral signals (loudspeaker to same side ear) and cancel out contralateral crosstalk (loudspeaker to opposite side ear). FIG. 3 shows the crosstalk canceler 204 for canceling the crosstalk at the two ears (viz., reproducing left-channel program at the left ear and the right-channel program at the right-ear).

Referring to FIG. 3, for the crosstalk canceller 204, the acoustic path ipsilateral responses $G_{11}(z)$ and $G_{22}(z)$ (e.g., same-side speaker as the ear) and contralateral responses $G_{12}(z)$ and $G_{21}(z)$ (e.g., opposite-side speaker as the ear) may be determined based on the distance and angle of the ears to the speakers. For example, FIG. 3 illustrates speakers 300 and 302, respectively also denoted speaker-1 and speaker-2 in FIG. 1. Further, a user's ears corresponding to the destinations 304 and 306 may be respectively denoted as ear-1 and ear-2. In this regard $G_{11}(z)$ may represent the transfer function from speaker-1 to ear-1, $G_{22}(z)$ may represent the transfer function from speaker-2 to ear-2, and $G_{12}(z)$ and $G_{21}(z)$ may represent the crosstalks. The crosstalk canceller 204 may be denoted by the matrix H(z), which may be designed to send a signal $X_1$ to ear-1, and a signal $X_2$ to ear-2. For the example of FIG. 3, the angle of the ears to the speakers 300 and 302 may be specified as 15° relative to a median plane, where devices such as notebooks, desktop computers, mobile telephones, etc., may include speakers towards the end or edges of a screen.

For the example layout of the crosstalk canceller and the binaural acoustic transfer function of FIG. 3, the acoustic responses (viz., the $G_{ij}(z)$ for the source angles) may include the HRTFs corresponding to ipsilateral and contralateral transfer paths. The HRTFs may be obtained from an HRTF database, such as an HRTF database from the Institute for Research and Coordination in Acoustics/Music (IRCAM).

Figure 4:
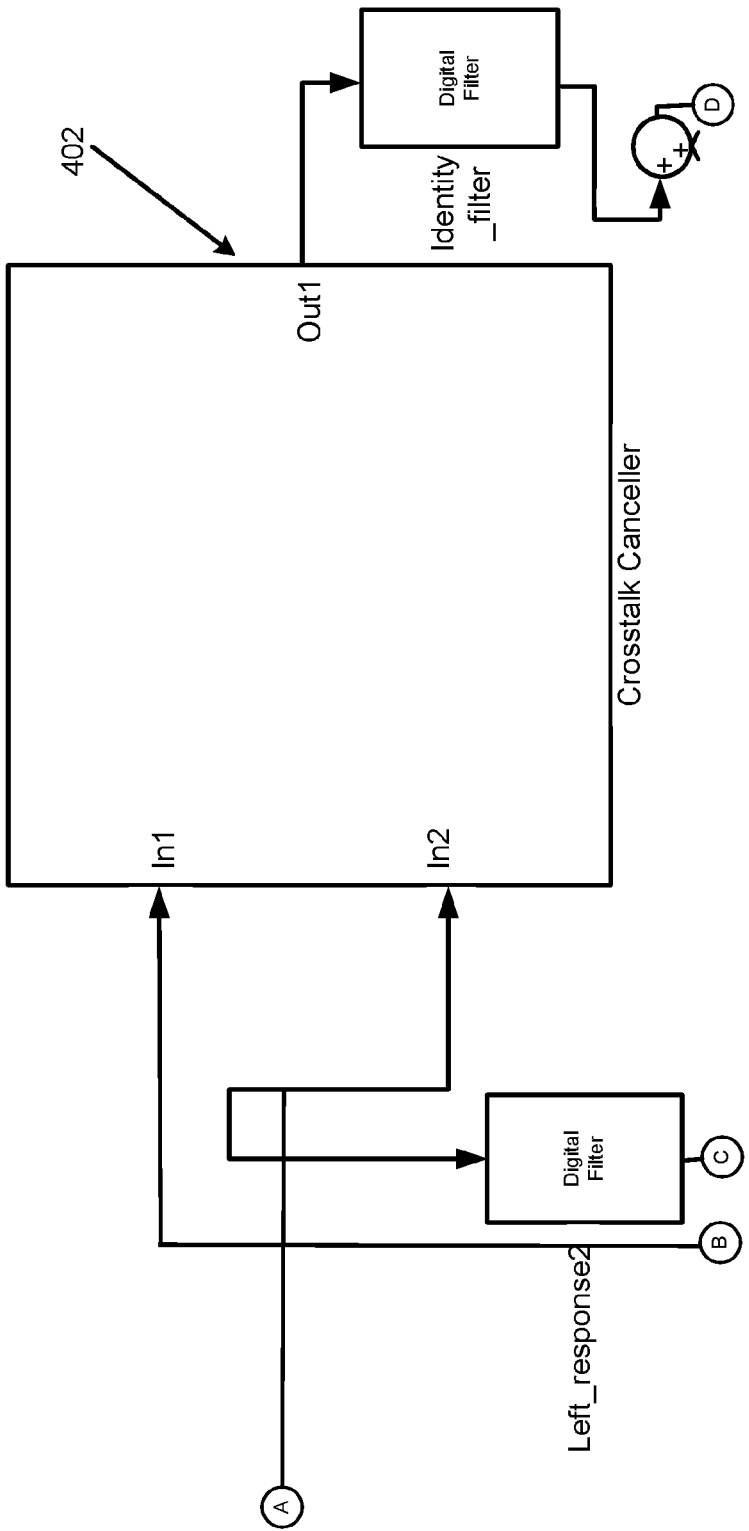
FIG. 4 illustrates an example layout of blocks of the immersive audio renderer of FIG. 1.
Figure 4:
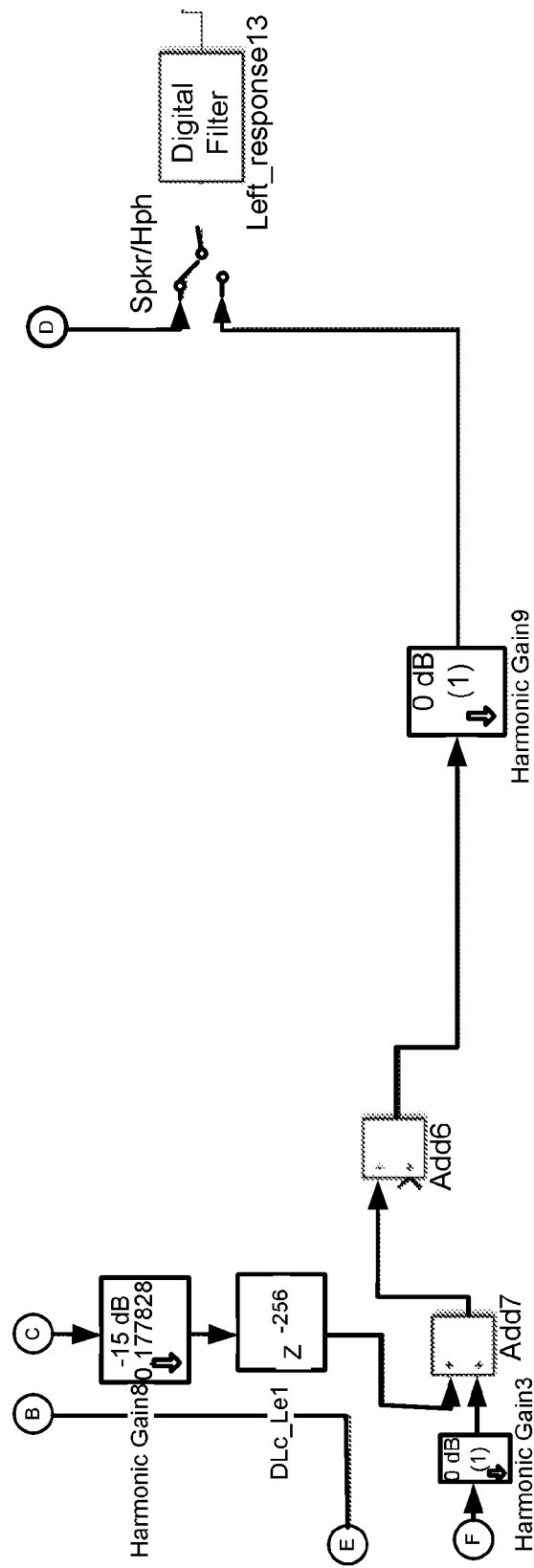
Figure 4:
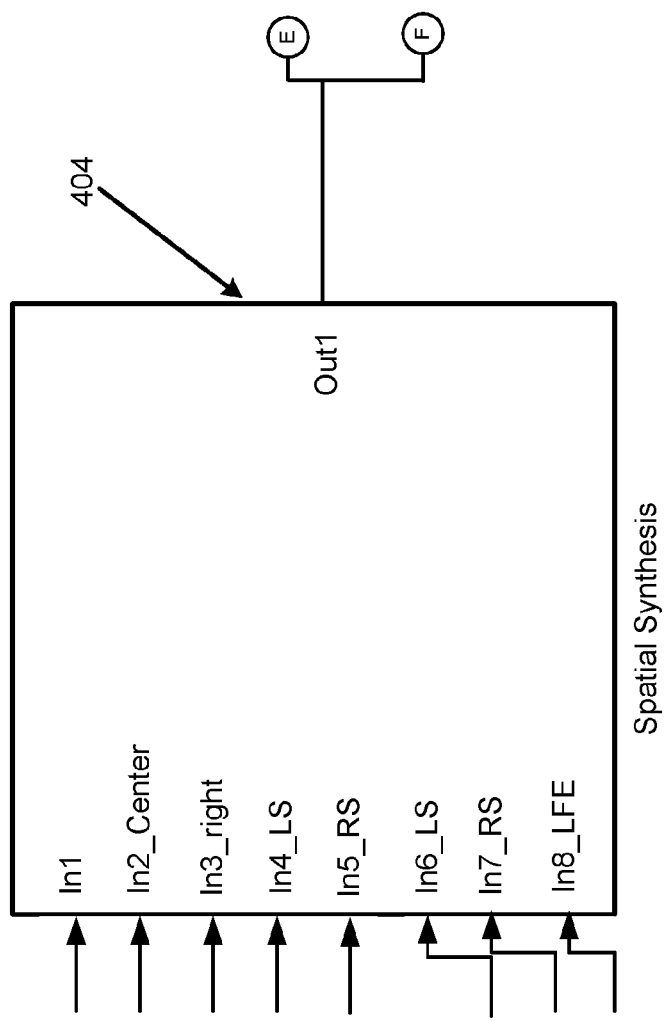

FIG. 4 illustrates an example layout of blocks of the immersive audio renderer of FIG. 1.

Referring to FIG. 4, a scaled ITU downmix block at 400 (e.g., see also spatial synthesis and binaural downmix block at 202) may be used to add enhancement to the processing by performing a version of the ITU downmix. The output of the scaled ITU downmix at 400 may be delivered to the crosstalk canceller at 402 (e.g., see also crosstalk canceller block at 204) and may also be applied to the output of a spatial synthesis block at 404 (e.g., see also spatial synthesis and binaural downmix block at 202). The combined output from the spatial synthesis block at 404 and the scaled ITU downmix at 400 may be delivered to the headphone renderer (see FIG. 2). The relative mix levels of the scaled ITU downmix block at 400 and the spatial synthesis block at 404 may be adjusted during a calibration phase with test content (e.g., pink noise, dialog, music, and affects and cinematic content). According to an example, an additional delay parameter may be included to delay the output of the scaled ITU downmix block at 400 by 256 samples due to decorrelation processing.

Figure 5:
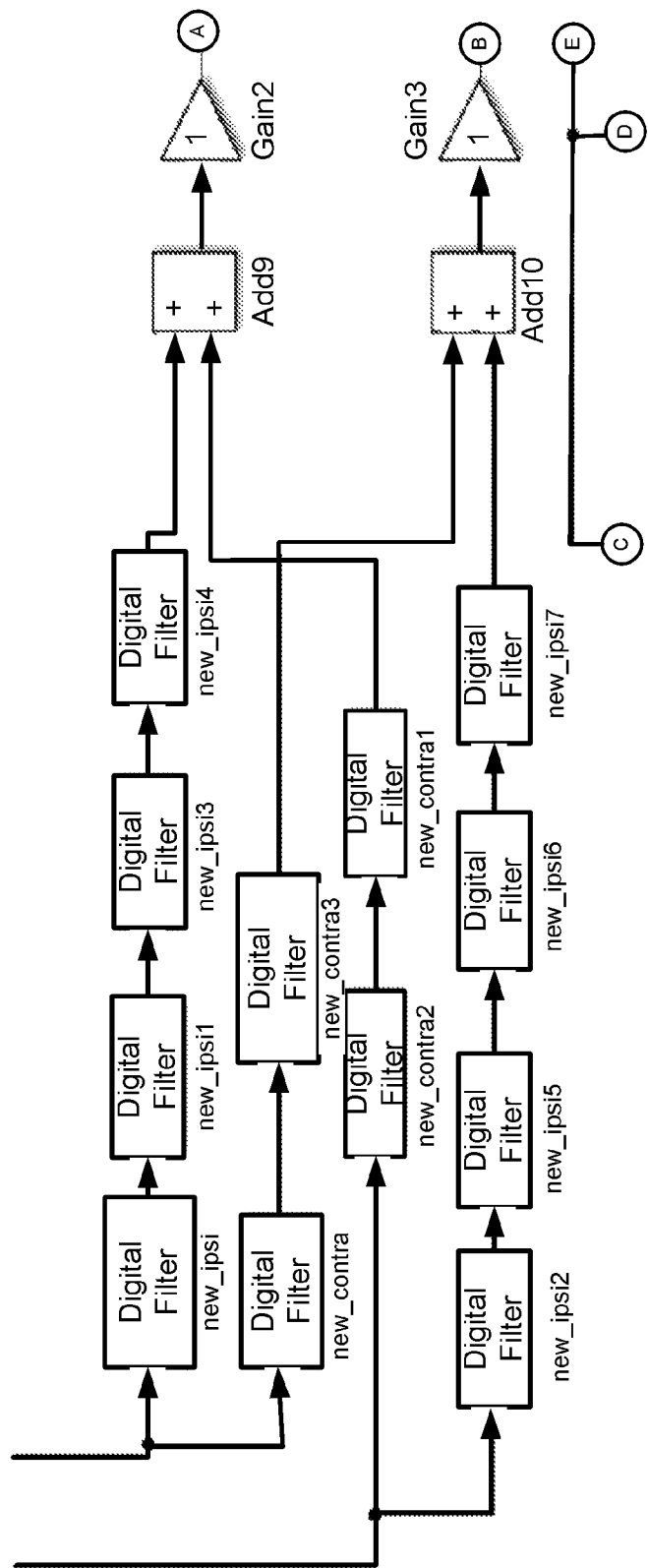
FIG. 5 illustrates an example layout of crosstalk canceler output mixed with scaled International Telecommunication Union (ITU) downmix output.
Figure 5:
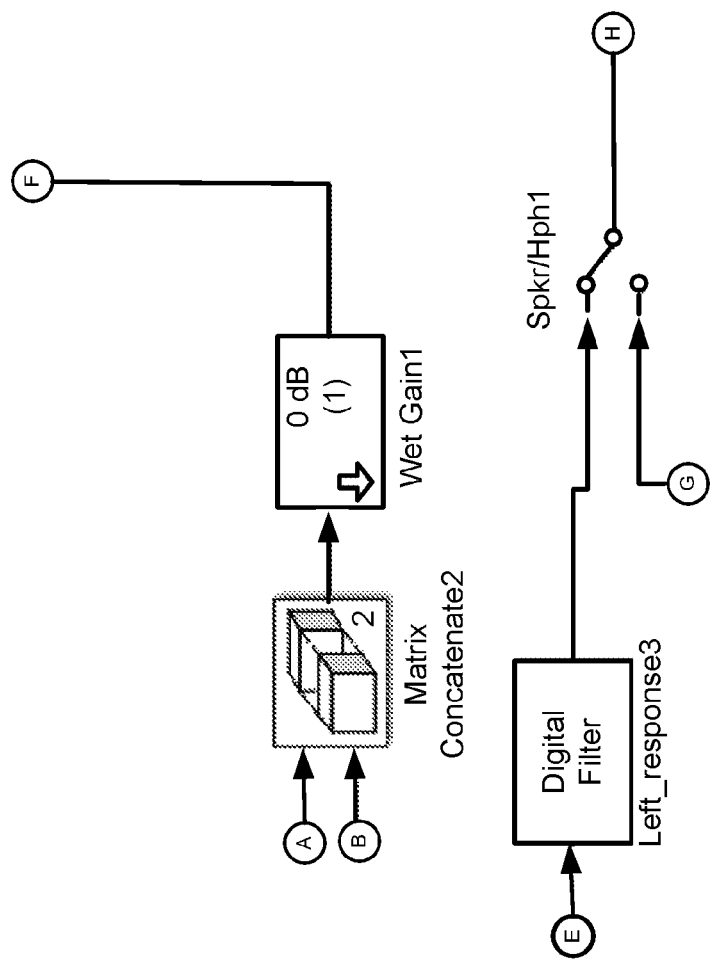
Figure 5:
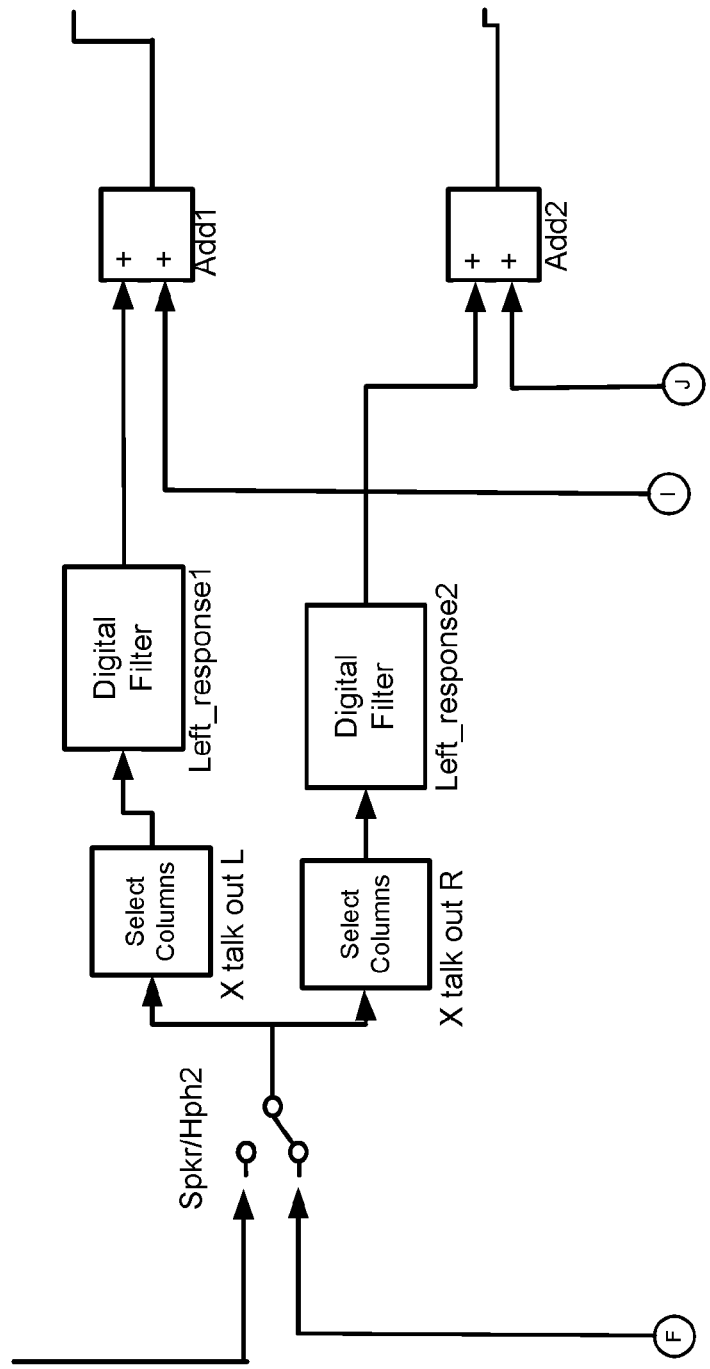
Figure 5:
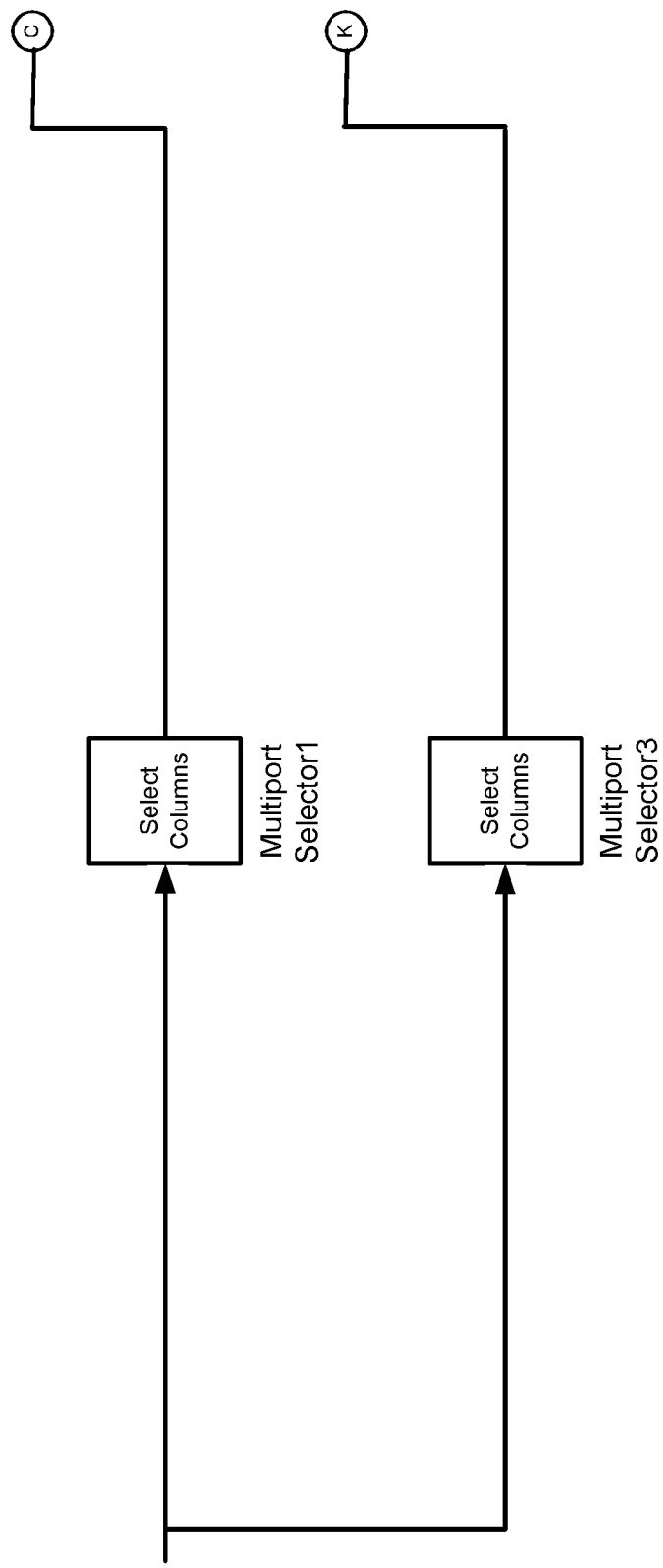
Figure 5:
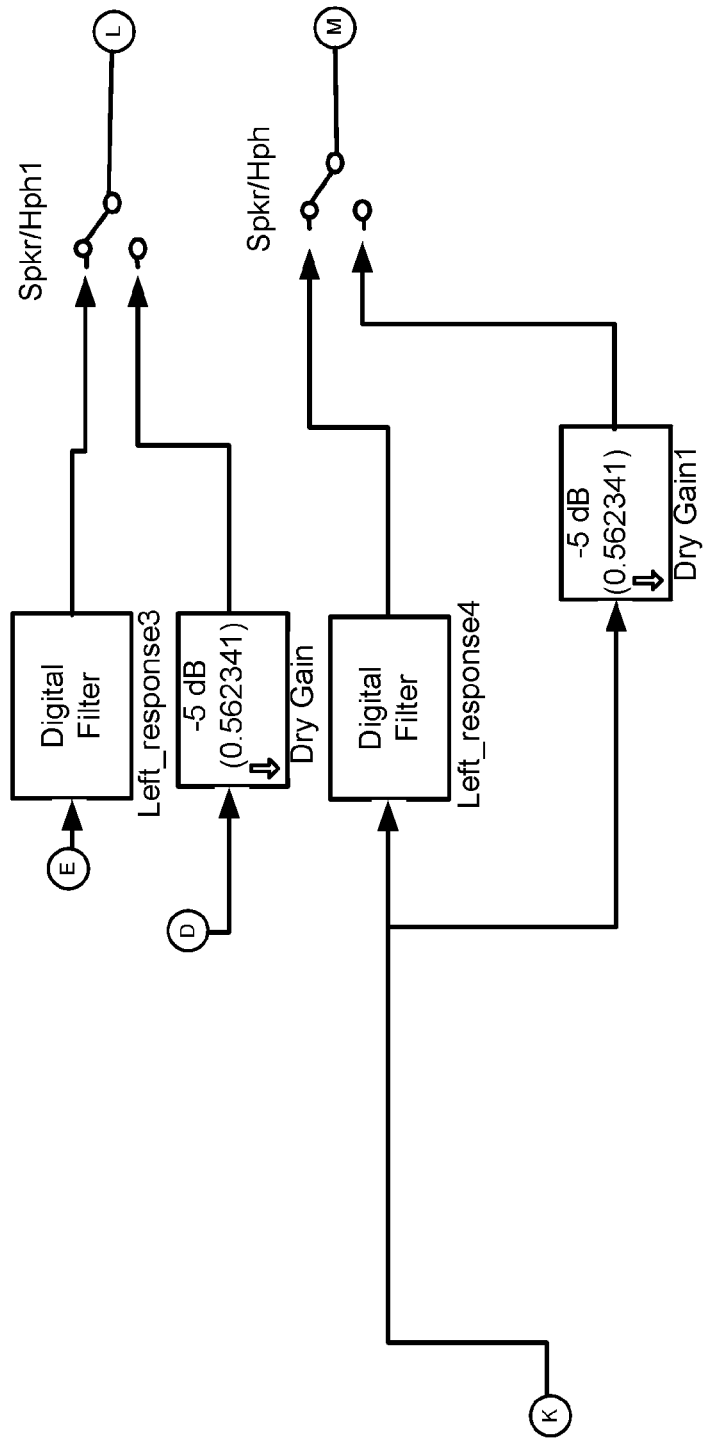
Figure 5:
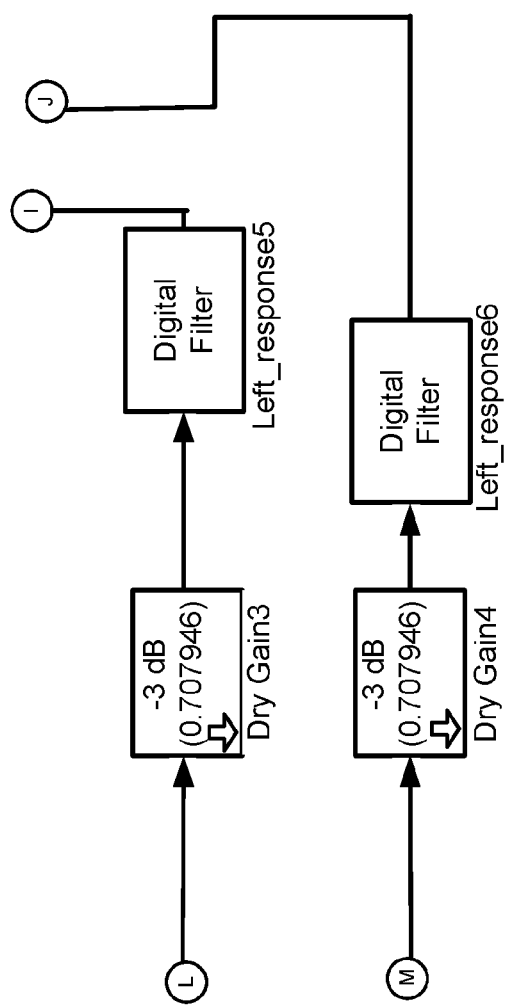

FIG. 5 illustrates an example layout of crosstalk canceler output mixed with scaled International Telecommunication Union (ITU) downmix output.

Referring to FIG. 5, FIG. 5 illustrates details of the blocks that generate a scaled ITU downmix two-channel output, $\underline{Y}$ using the following matrixed equation:

$$H = \begin{pmatrix} 10^{-g1/20} & 10^{-g2/20} & 10^{-g3/20} & 10^{-g4/20} & 10^{-g5/20} \\ 10^{-g1/20} & 10^{-g2/20} & 10^{-g3/20} & 10^{-g4/20} & 10^{-g5/20} \end{pmatrix} \quad \text{Equation (1)}$$

For Equation (1), $\underline{Y}=H\underline{X}$, with
$\underline{X}$=(Left, Center, Right, LeftSurround, RightSurround)$^t$.
According to an example, $g_i=0.71 \forall i$.

Referring to FIG. 5, the crosstalk canceler (e.g., the crosstalk canceller block at 204) may perform equalization of the ipsilateral signals (loudspeaker to same side ear) and cancel out contralateral crosstalk (loudspeaker to opposite side ear). In the example of FIG. 5, crosstalk may also be denoted as "Xtalk". The output from scaled ITU downmix may be sent to the crosstalk canceller block at 204 and may be further filtered by a bass-boost or cut, or treble-boost or cut with a gain to control the mix level when combined with the crosstalk-canceler output. In FIG. 5, the crosstalk canceler blocks are denoted as "Xtalk outL" and "Xtalk outR", and the additional processing for filtering the scaled ITU downmix may include the remaining blocks of FIG. 5, with the gain and filter block parameters being included as part of a tuning graphical user interface.

Figure 6:
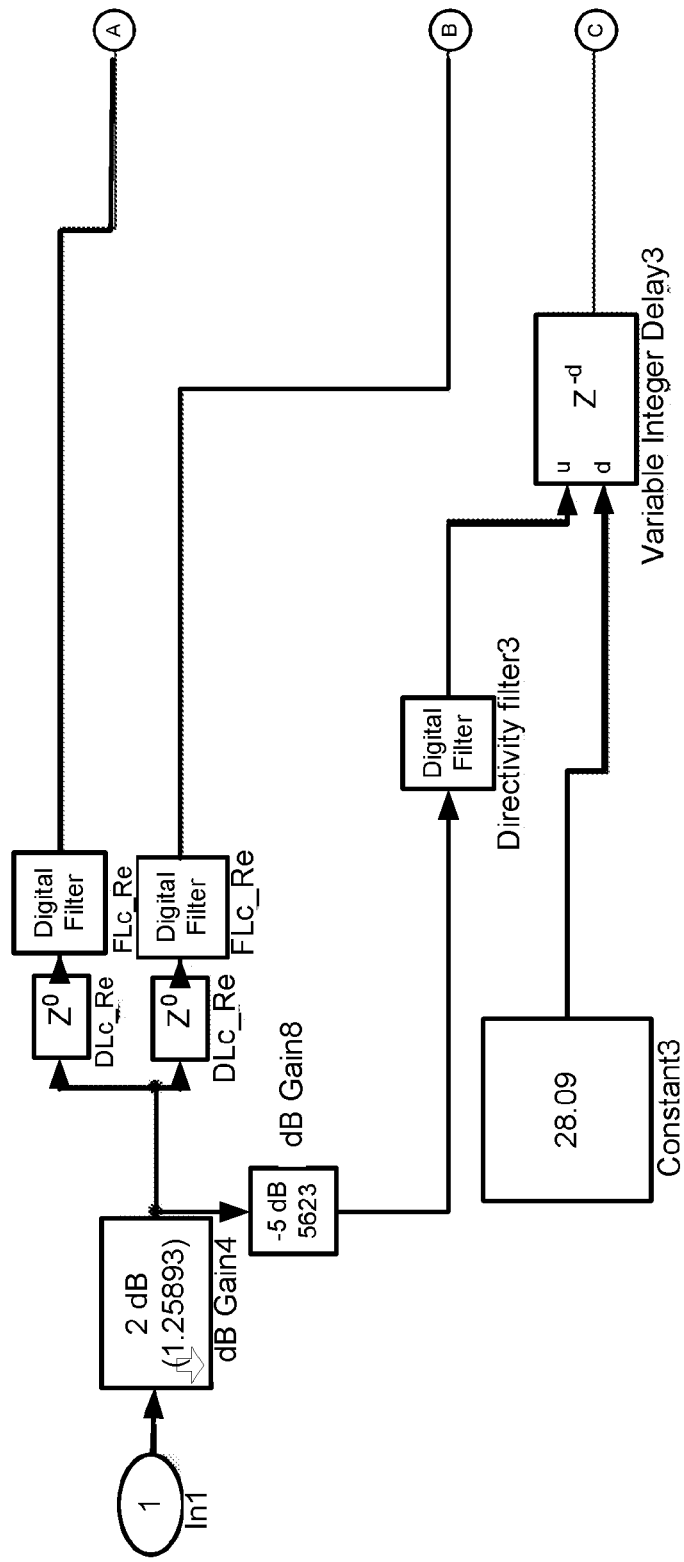
FIG. 6 illustrates an example layout of spatial synthesis with virtual sources and floor-reflection.
Figure 6:
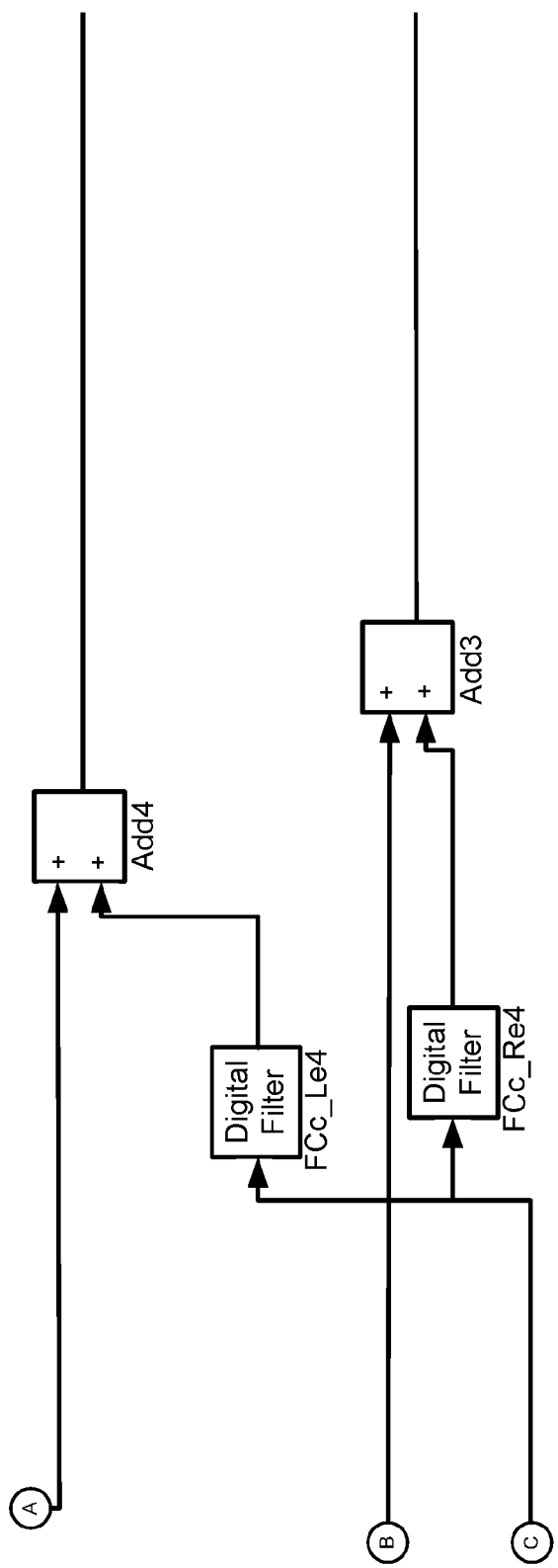
Figure 6:
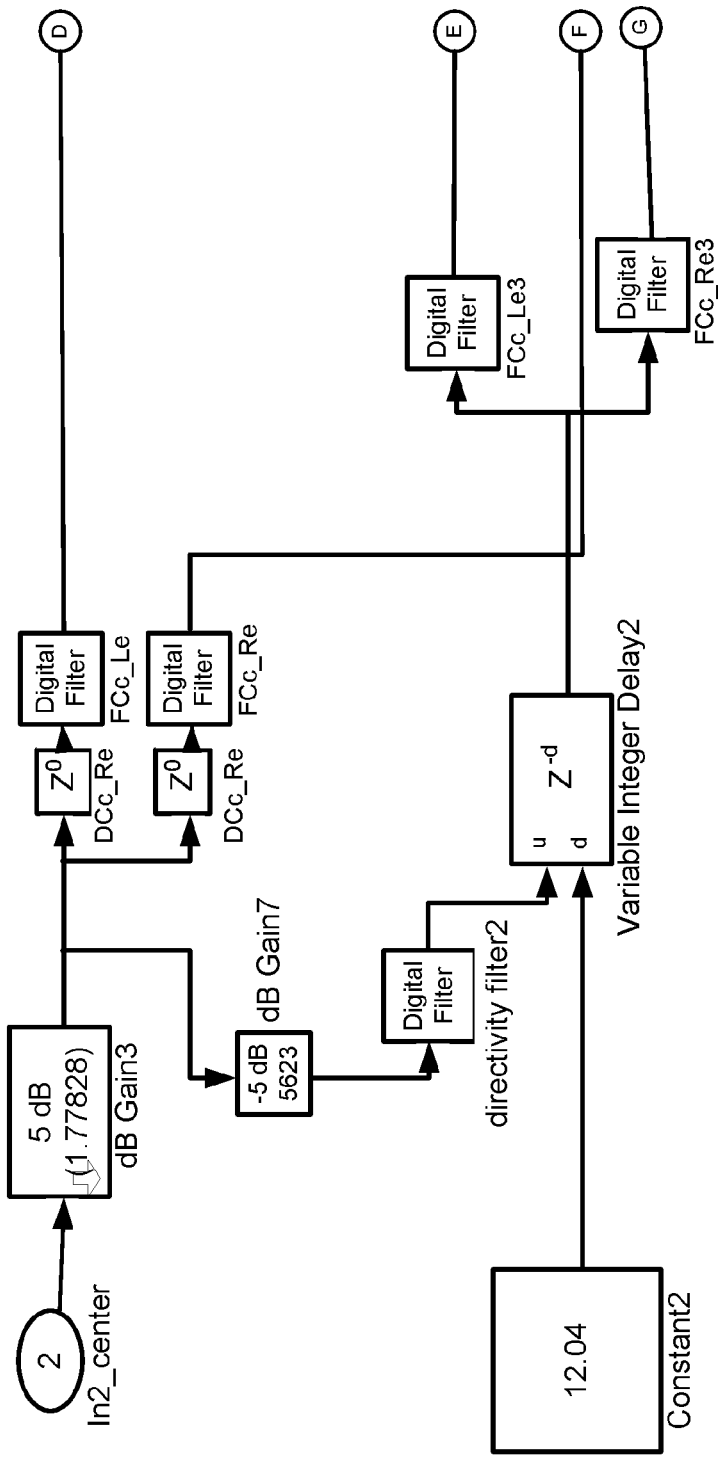
Figure 6:
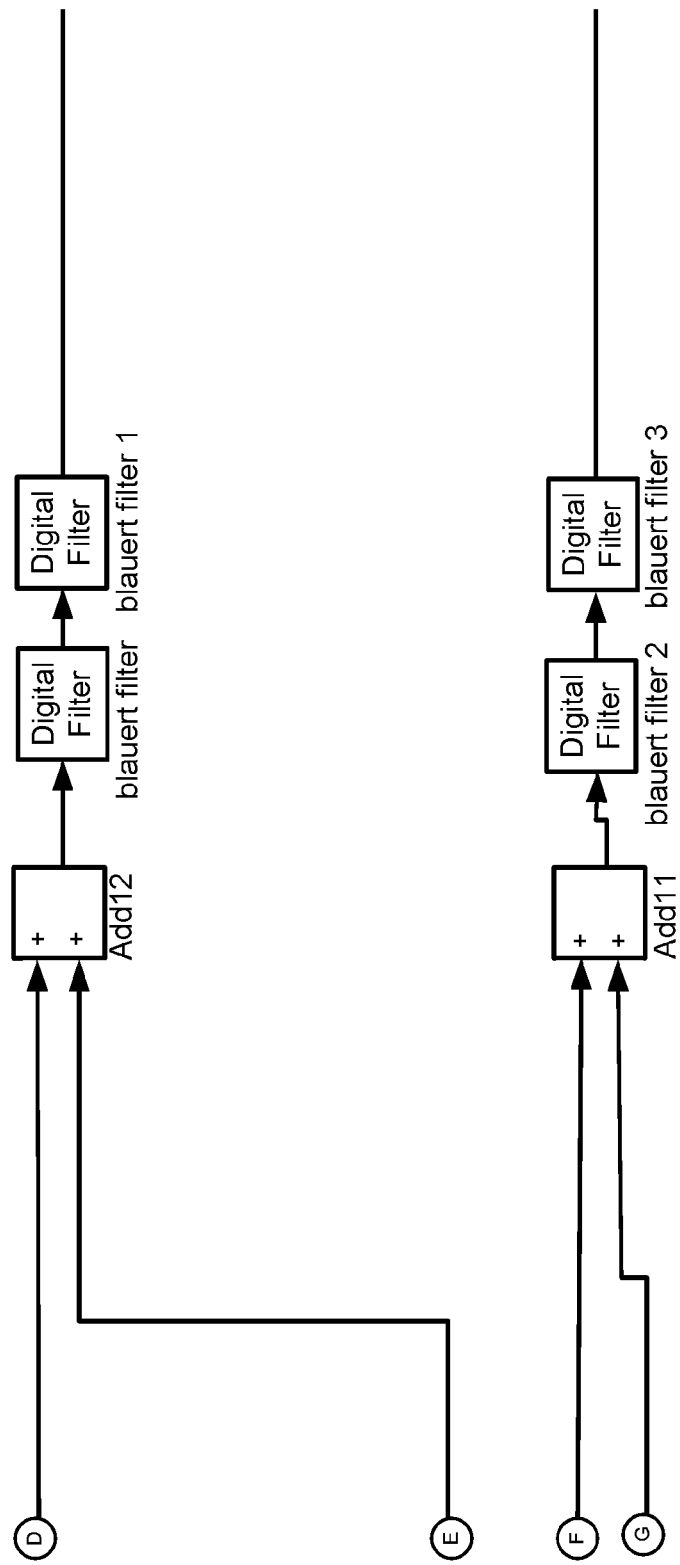
Figure 6:
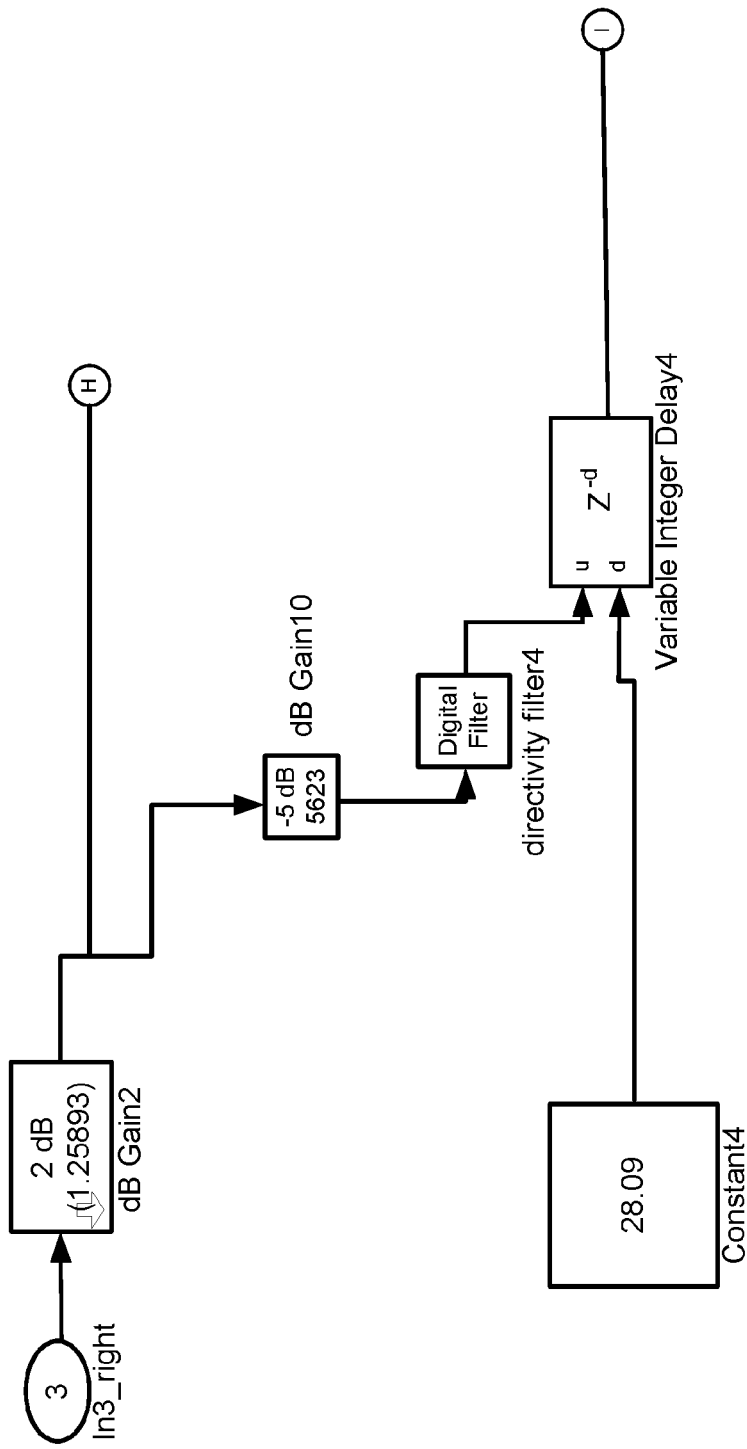
Figure 6:
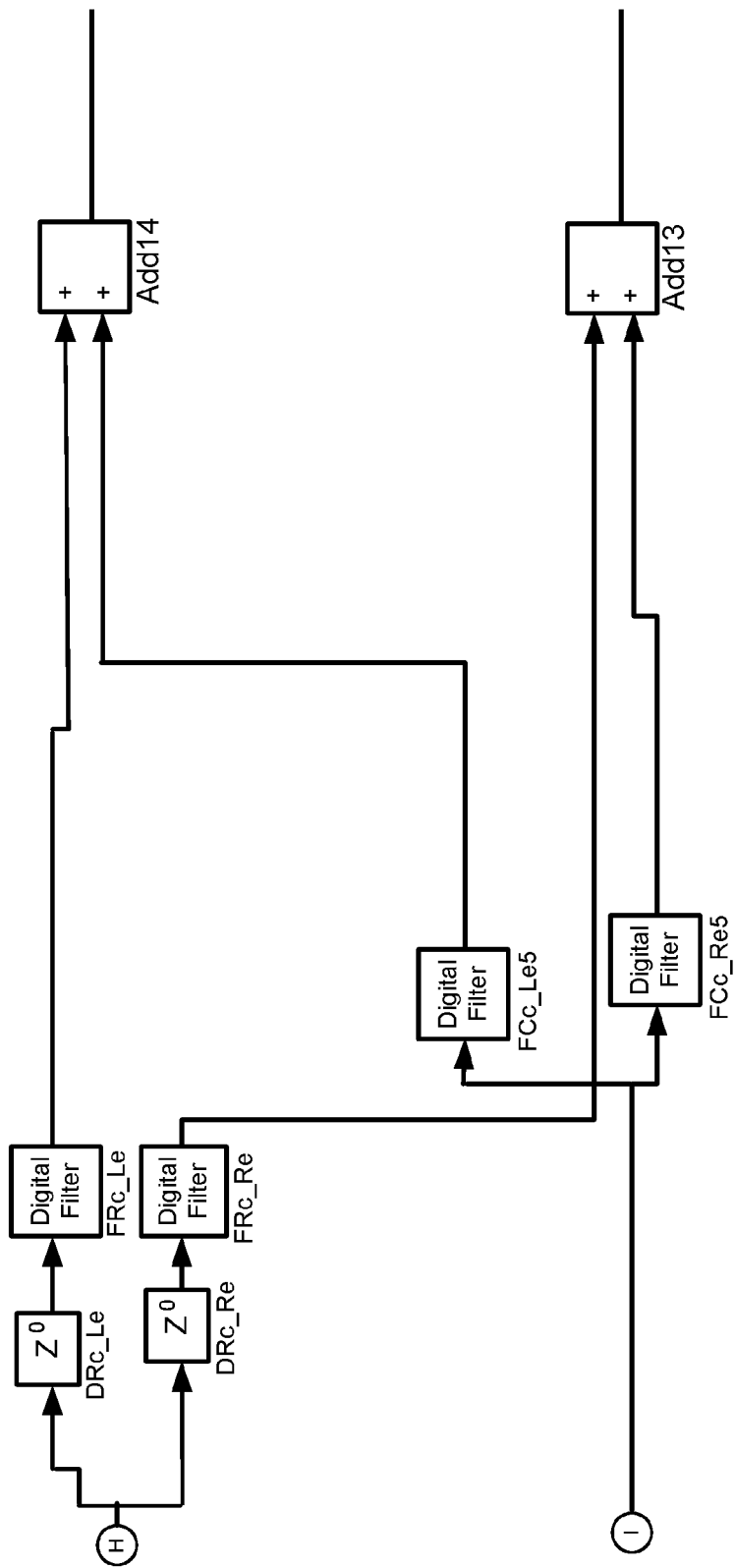
Figure 6:
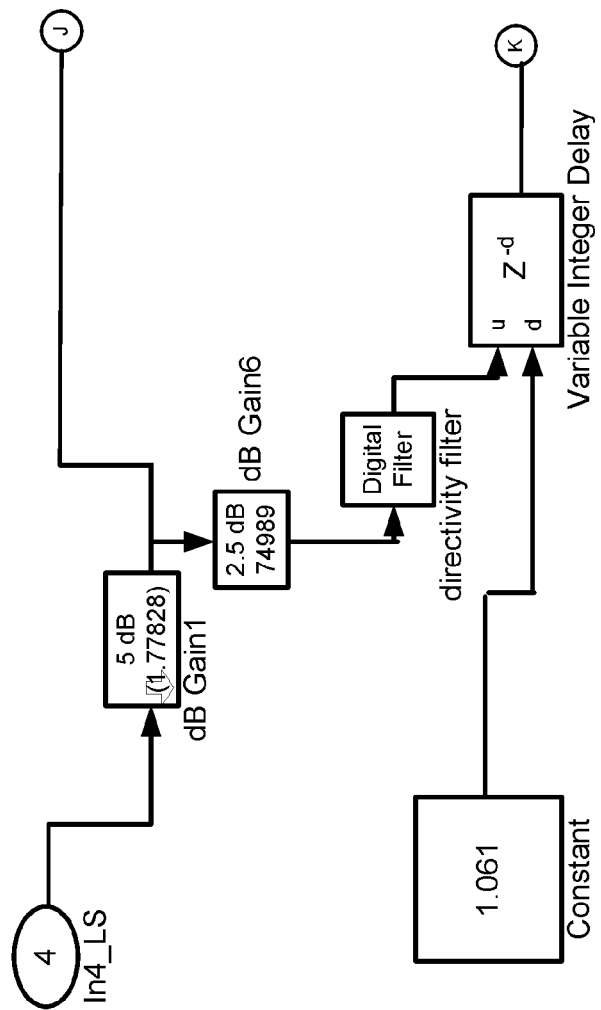
Figure 6:
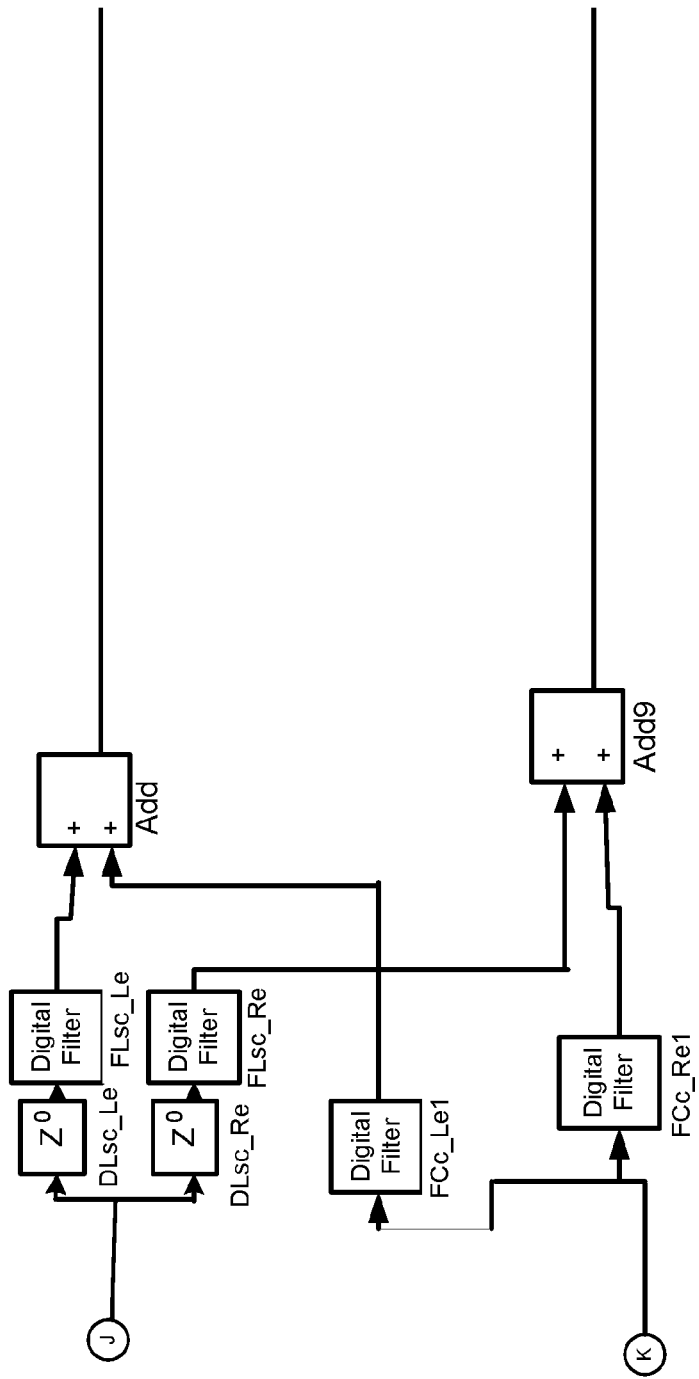
Figure 6:
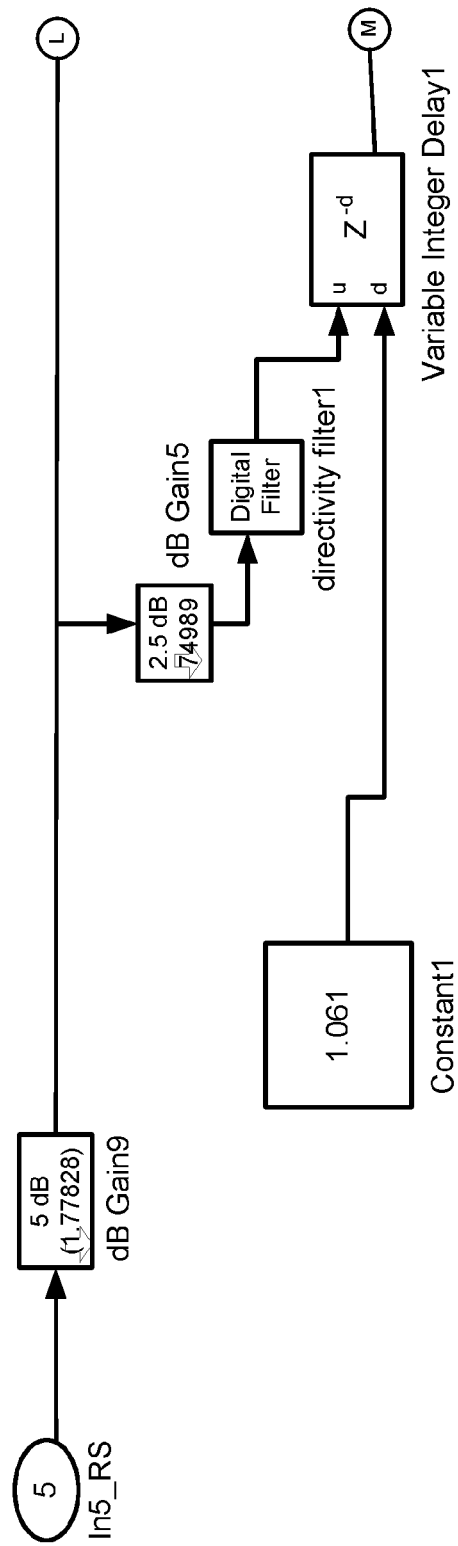
Figure 6:
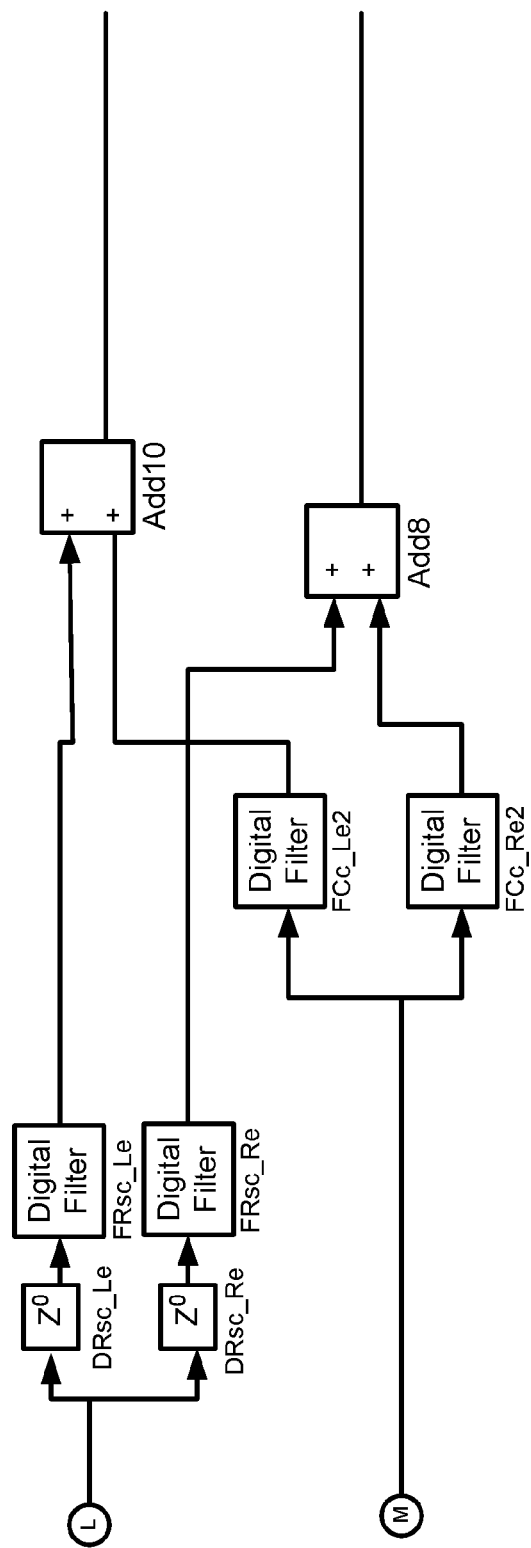

FIG. 6 illustrates an example layout of spatial synthesis with virtual sources and floor-reflection.

Referring to FIG. 6, the spatial synthesis block (e.g., the spatial synthesis and binaural downmix block at 202) may apply HRTFs to render virtual sources at desired angles (and distances). In this regard, crosstalk cancellation with respect to the crosstalk canceller block at 204 may be based on perceptual smoothing of HRTFs, insertion of an inter-aural time difference, and time-domain inversion of a regularized matrix determined from the perceptually smoothed HRTFs. For example, a constrained inversion of the perceptually smoothed HRTFs may be performed through the use of regularization, and validation of a condition number of a regularized matrix before inversion. In this regard, a tradeoff may be achieved, for example, by analyzing the condition number with respect to an objective cancellation performance, a subjective audio quality, and robustness to head-movements.

For the crosstalk canceller block at 204, a perceptual smoothing may be performed on HRTFs corresponding to ipsilateral and contralateral transfer paths of sound emitted from first and second speakers (e.g., see FIG. 1), respectively, to corresponding first and second destinations. According to an example, the perceptual smoothing may include phase and magnitude smoothing, or complex smoothing of the HRTFs. According to an example, the first and second destinations may respectively correspond to first and second ears of a user.

An inter-aural time difference may be inserted in the perceptually smoothed HRTFs corresponding to the contralateral transfer paths. According to an example, the inter-aural time difference may be determined as a function of a head radius of the user, and an angle of one of the speakers (e.g., see FIG. 1) from a median plane of a device (e.g., the device 150) that includes the speakers.

The crosstalk canceller block at 204 may be generated by inverting the perceptually smoothed HRTFs corresponding to the ipsilateral transfer paths and the perceptually smoothed HRTFs corresponding to the contralateral transfer paths including the inserted inter-aural time difference. According to an example, the crosstalk canceller block at 204 may be generated by performing a time-domain inversion of a regularized matrix determined from the perceptually smoothed HRTFs corresponding to the ipsilateral transfer paths and the perceptually smoothed HRTFs corresponding to the contralateral transfer paths including the inserted inter-aural time difference. In this regard, a time-domain matrix may be determined from the perceptually smoothed HRTFs corresponding to the ipsilateral transfer paths and the perceptually smoothed HRTFs corresponding to the contralateral transfer paths including the inserted inter-aural time difference. Further, a regularization term (e.g., β) may be determined to control inversion of the time-domain matrix, and the time-domain matrix may be inverted based on the regularization term to generate the regularized matrix. Further, the regularization term to control the inversion of the time-domain matrix may be determined by comparing a condition number associated with a transpose of the time-domain matrix to a threshold (e.g., 100), and in response to a determination that the condition number is below the threshold, the time-domain matrix may be inverted based on the regularization term to generate the regularized matrix. Thus, the condition number of the regularized matrix may be validated prior to the performing of the time-domain inversion of the regularized matrix.

For the example of FIG. 6, the perceptually-smoothed HRTFs used may be for angles ±40° for the front left and right sources (channels), 0° for the center, and ±110° for the left and right surround sources (channels). In this regard, FIG. 6 shows the blocks and filters for spatial synthesis for virtual sources at prescribed angles. Furthermore, additional delay and gain blocks may be added to emulate a dominant floor-reflection. For headphone rendering with spatial synthesis, the image is perceived to be unnaturally elevated and not in the horizontal plane. In this regard, according to an example, the elevation perception, for horizontal virtual sources, may be reduced through controlled reflections. The controlling parameters may include the delay and intensity of the reflection relative to the direct sound from the virtual sources. These parameters may be set from listening tests using monophonic test signals (e.g., pink noise and speech). The delays for the left, center, right, left-surround and right-surround channels may be determined to be (in samples) 12, 28, 12, 1, and 1 respectively. The gains (in dB) may be determined to be −5 dB for the front channels or sources (Left, Center, Right), and −2.5 dB for the two surrounds. Additional reflections and reverberation may be excluded in order to avoid typical artifacts perceived from virtualizers.

The output from the virtual sources may be downmixed to two-channels via a linear summation of signals emulated at the left ear, and at the right ear, respectively.

Figure 7:
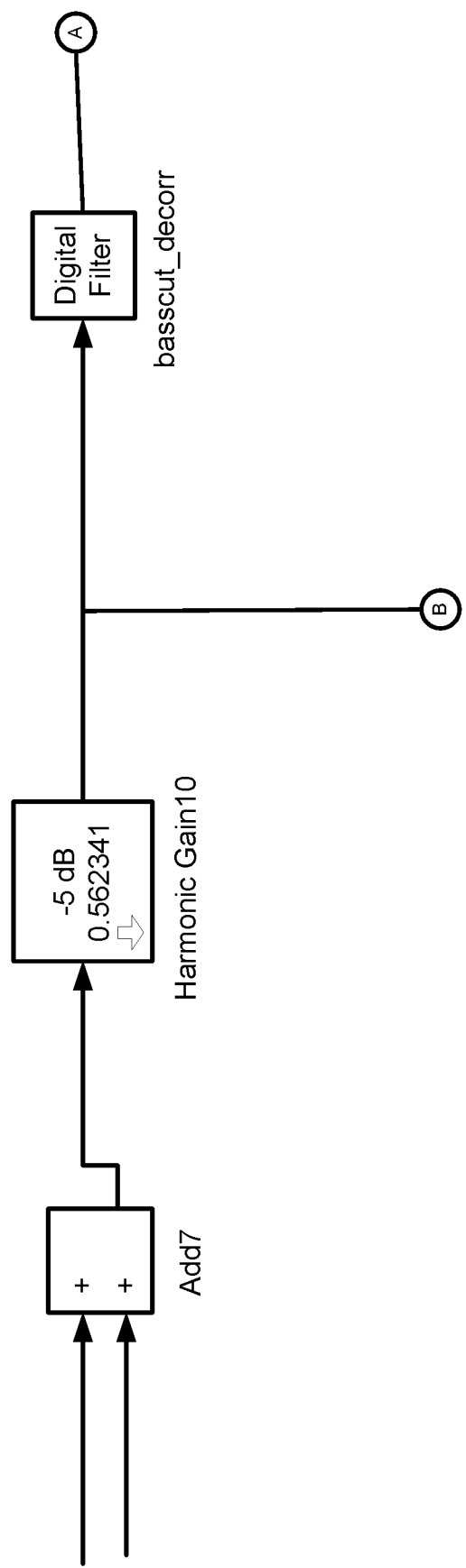
FIG. 7 illustrates decorrelation filters with their appropriate mixing gains and filters.
Figure 7:
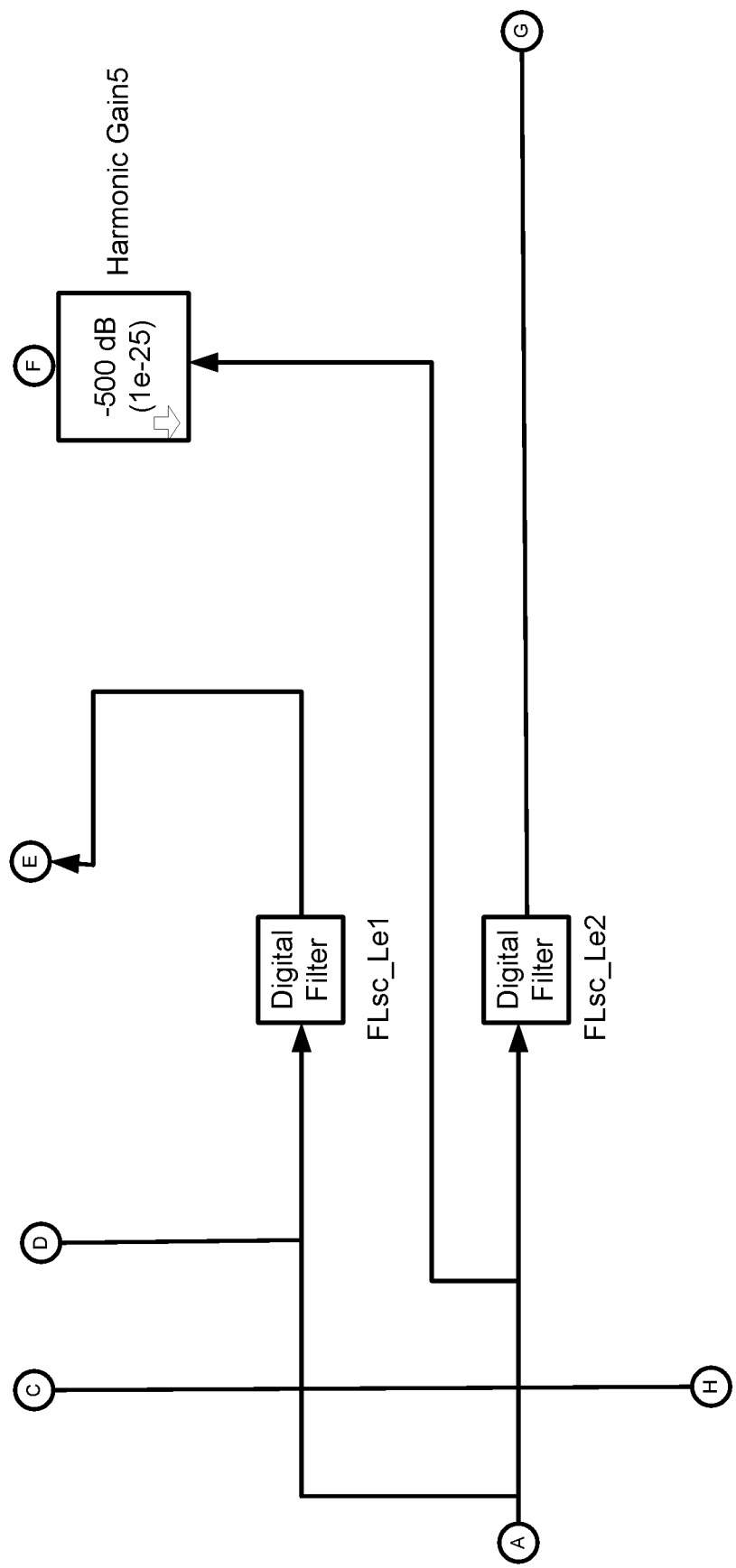
Figure 7:
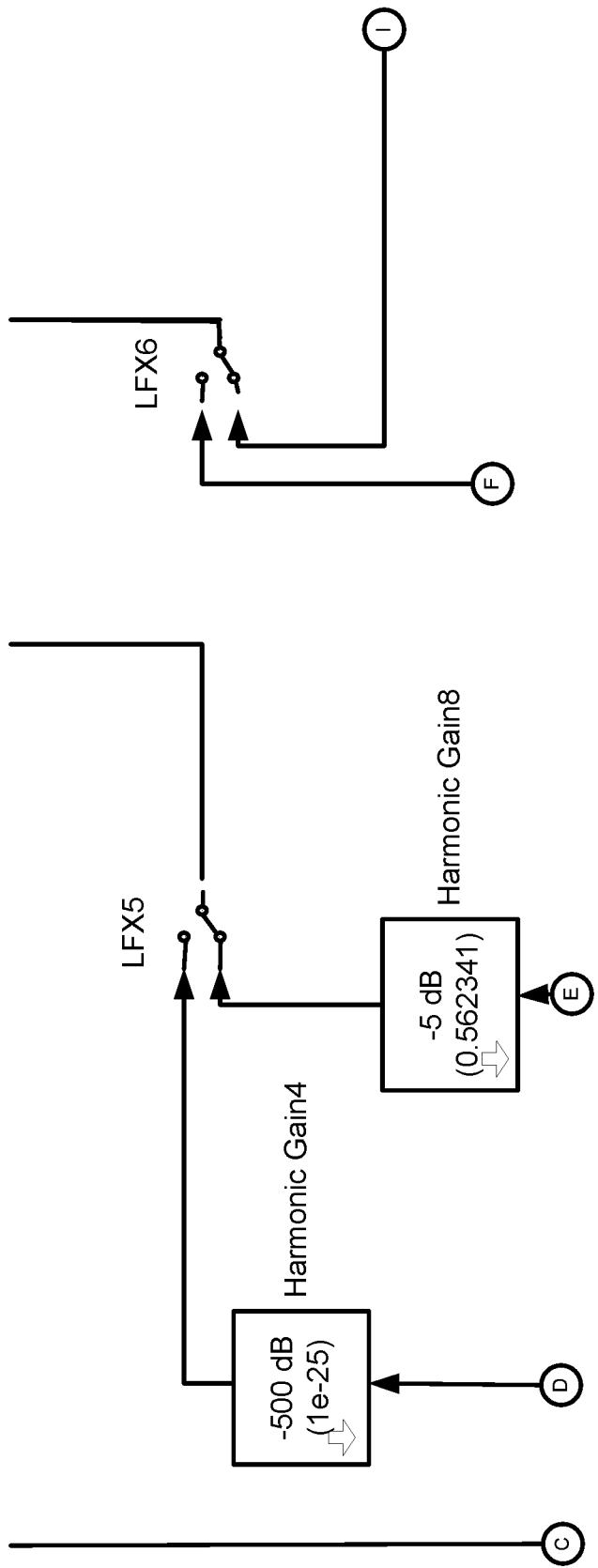
Figure 7:
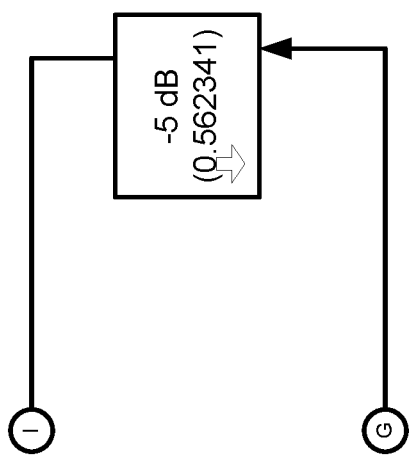
Figure 7:
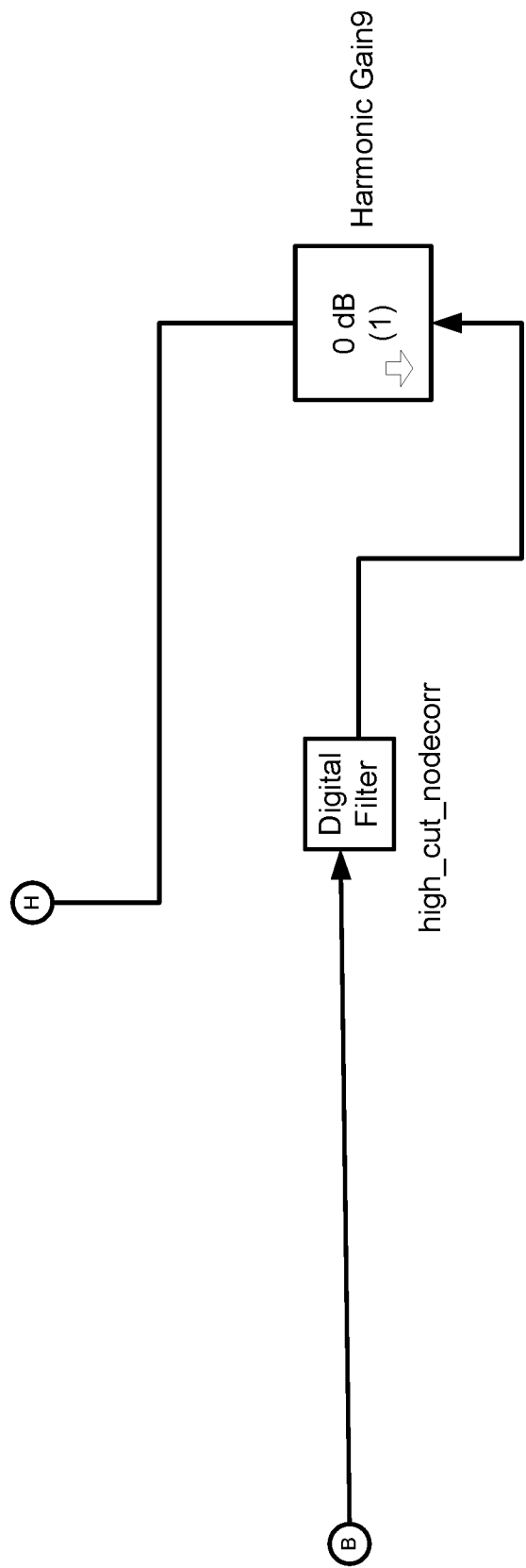

FIG. 7 illustrates decorrelation filters with their appropriate mixing gains and filters.

Referring to FIG. 7, decorrelation may be applied to the surround channels to create a diffuse sound-field and the decorrelated output may be mixed at a relative level with the output from the spatial synthesis and binaural downmix block at 202 from the virtual point sources. The decorrelation may be applied to the higher frequencies and not to the low-range or mid-range frequencies. This is to preclude the decorrelation of bass and voice frequency regions, where decorrelation of the bass/voice region may create a perception of lack of bass and/or presence. The decorrelation may be performed through all pass filters, with complementary filters of order N, $AP_1(z)$ and $AP_2(z)$ in the two channels. Specifically, $$AP_1(z) = \frac{z^{-N} - \lambda}{1 - z^{-N}\lambda} \qquad \text{Equation (2)}$$

$$AP_1(z) = \frac{z^{-N} + \lambda}{1 + z^{-N}\lambda} \qquad \text{Equation (3)}$$

For Equations (2) and (3), $z=e^{\{jw\}}$, $j=sqrt(-1)$, w may represent the angular frequency in radians and is related to linear frequency f (in Hz) as $w=2\pi f/fs$ (fs being the sampling frequency of the audio content), N may represent an integer that determines the order of the all-pass filter, $\lambda$ may represent the coefficient and $|\lambda|<1$.

Figure 8:
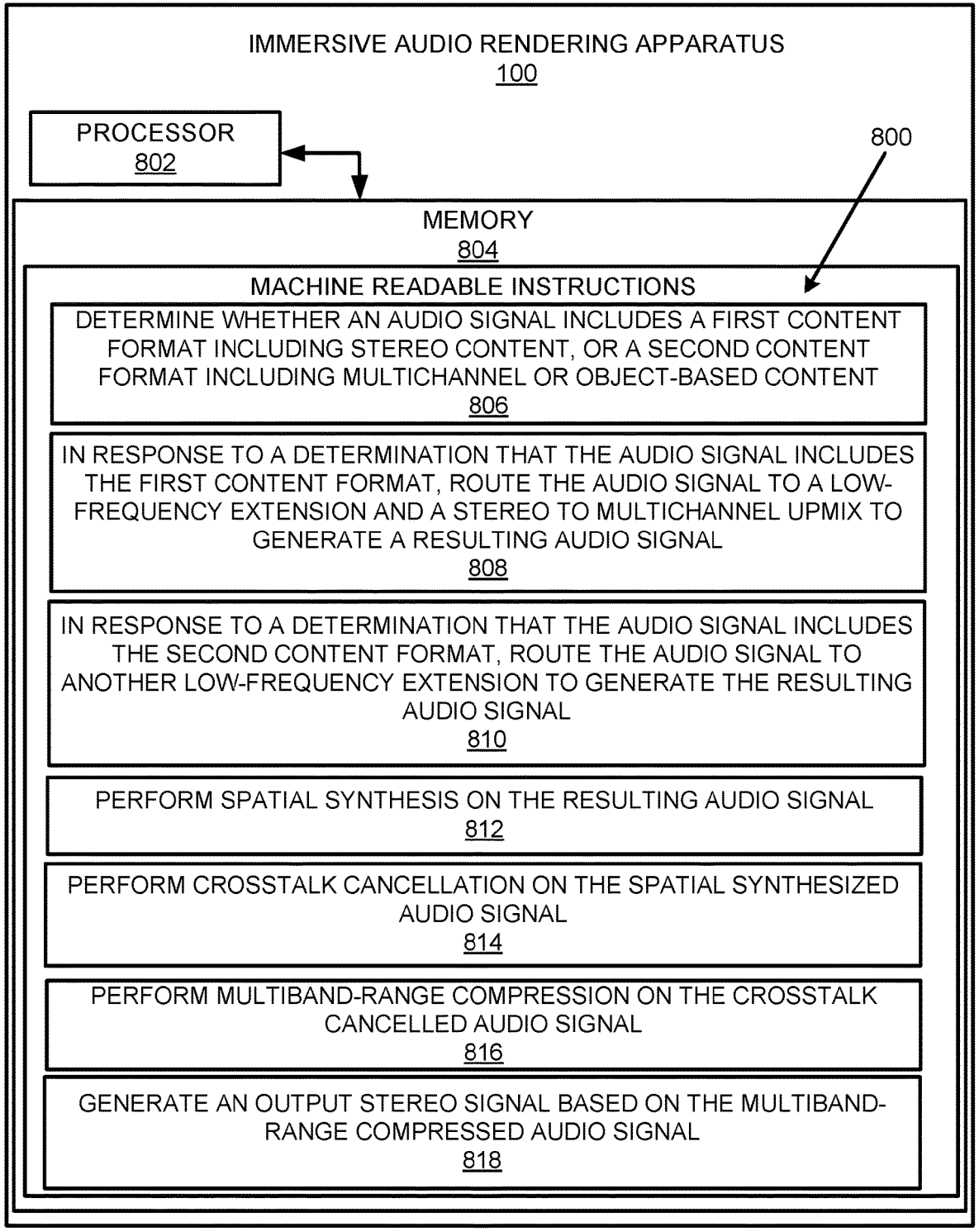
FIG. 8 illustrates an example block diagram for immersive audio rendering.
Figure 9:
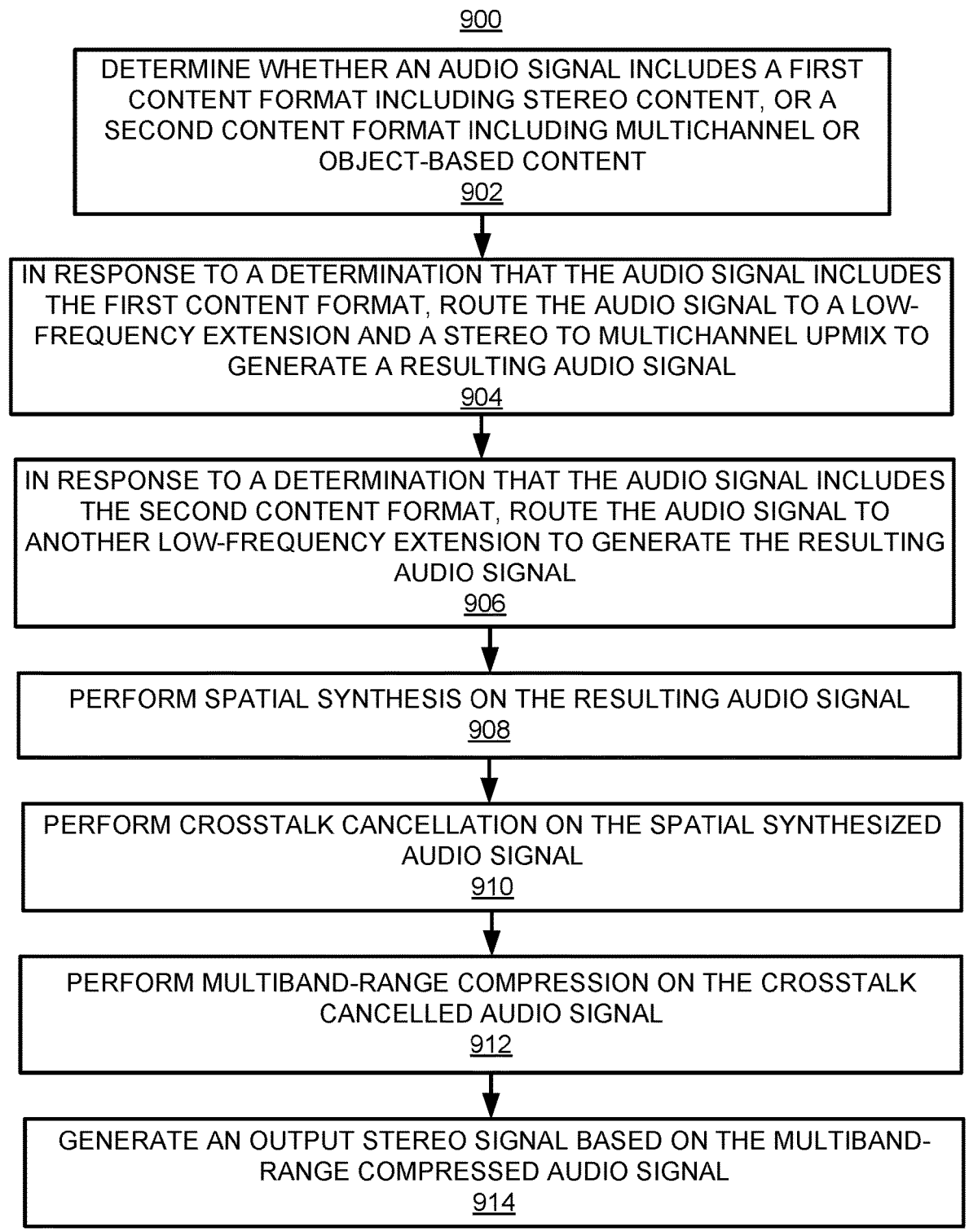
FIG. 9 illustrates an example flowchart of a method for immersive audio rendering.
Figure 10:
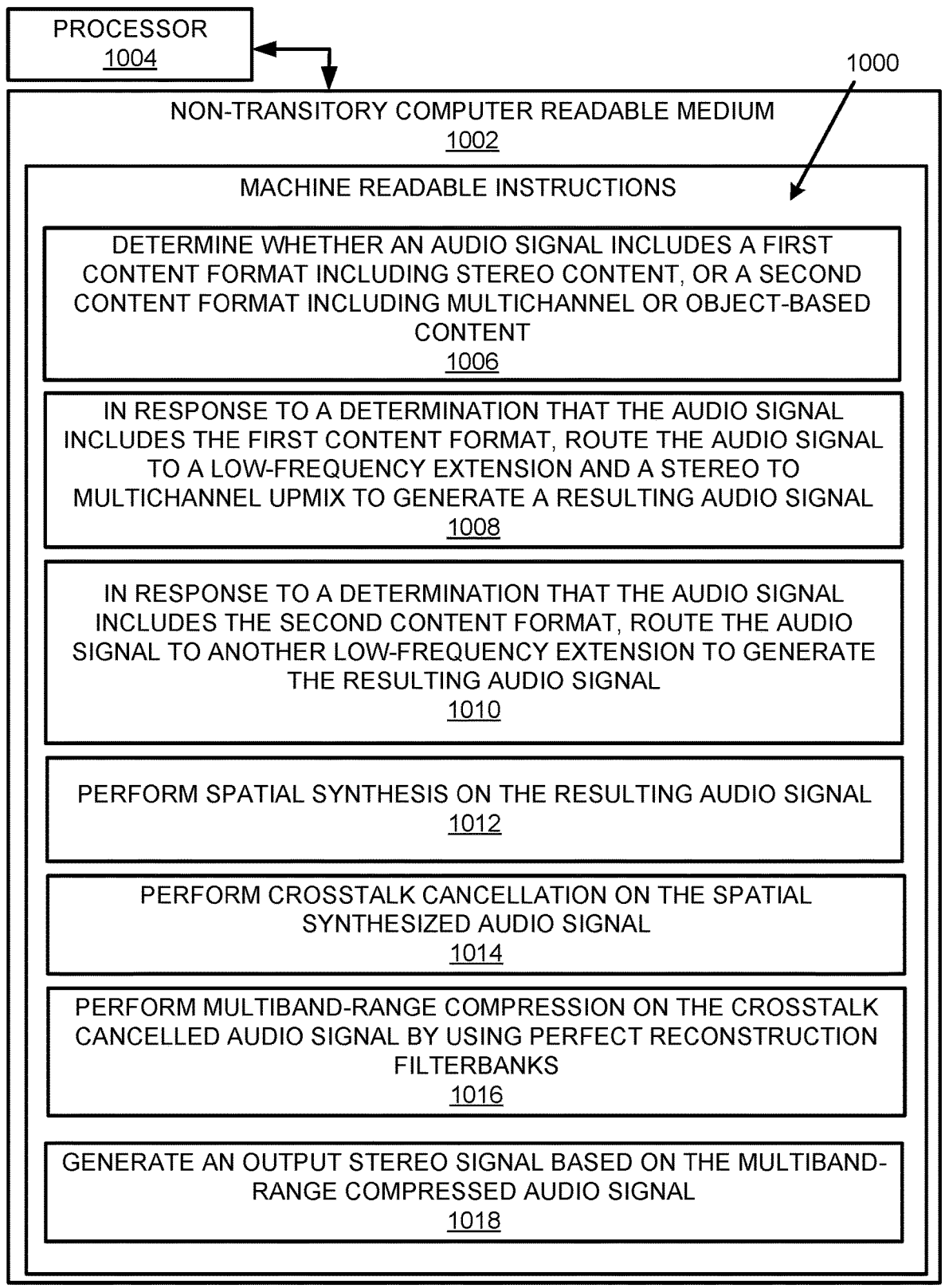
FIG. 10 illustrates a further example block diagram for immersive audio rendering.

FIGS. 8-10 respectively illustrate an example block diagram 800, an example flowchart of a method 900, and a further example block diagram 1000 for immersive audio rendering. The block diagram 800, the method 900, and the block diagram 1000 may be implemented on the apparatus 100 described above with reference to FIG. 1 by way of example and not limitation. The block diagram 800, the method 900, and the block diagram 1000 may be practiced in other apparatus. In addition to showing the block diagram 800, FIG. 8 shows hardware of the apparatus 100 that may execute the instructions of the block diagram 800. The hardware may include a processor 802, and a memory 804 (i.e., a non-transitory computer readable medium) storing machine readable instructions that when executed by the processor cause the processor to perform the instructions of the block diagram 800. The memory 804 may represent a non-transitory computer readable medium. FIG. 9 may represent a method for immersive audio rendering, and the steps of the method. FIG. 10 may represent a non-transitory computer readable medium 1002 having stored thereon machine readable instructions to provide immersive audio rendering. The machine readable instructions, when executed, cause a processor 1004 to perform the instructions of the block diagram 1000 also shown in FIG. 10.

The processor 802 of FIG. 8 and/or the processor 1004 of FIG. 10 may include a single or multiple processors or other hardware processing circuit, to execute the methods, functions and other processes described herein. These methods, functions and other processes may be embodied as machine readable instructions stored on a computer readable medium, which may be non-transitory (e.g., the non-transitory computer readable medium 1002 of FIG. 10), such as hardware storage devices (e.g., RAM (random access memory), ROM (read only memory), EPROM (erasable, programmable ROM), EEPROM (electrically erasable, programmable ROM), hard drives, and flash memory). The memory 804 may include a RAM, where the machine readable instructions and data for a processor may reside during runtime.

Referring to FIGS. 1-8, and particularly to the block diagram 800 shown in FIG. 8, the memory 804 may include instructions 806 to determine whether an audio signal 104 includes a first content format 106 including stereo content, or a second content format 108 including multichannel or object-based content.

The processor 802 may fetch, decode, and execute the instructions 808 to in response to a determination that the audio signal 104 includes the first content format 106, route the audio signal 104 to a low-frequency extension 112 and a stereo to multichannel upmix 114 to generate a resulting audio signal 116.

The processor 802 may fetch, decode, and execute the instructions 810 to in response to a determination that the audio signal 104 includes the second content format 108, route the audio signal 104 to another low-frequency extension 118 to generate the resulting audio signal 116.

The processor 802 may fetch, decode, and execute the instructions 812 to perform spatial synthesis on the resulting audio signal 116.

The processor 802 may fetch, decode, and execute the instructions 814 to perform crosstalk cancellation on the spatial synthesized audio signal 104.

The processor 802 may fetch, decode, and execute the instructions 816 to perform multiband-range compression on the crosstalk cancelled audio signal 104.

The processor 802 may fetch, decode, and execute the instructions 818 to generate an output stereo signal 130 based on the multiband-range compressed audio signal 104.

Referring to FIGS. 1-8 and 9, and particularly FIG. 9, for the method 900, at block 902, the method may include determining whether an audio signal 104 includes a first content format 106 including stereo content, or a second content format 108 including multichannel or object-based content.

At block 904, the method may include in response to a determination that the audio signal 104 includes the first content format 106, routing the audio signal 104 to a low-frequency extension 112 and a stereo to multichannel upmix 114 to generate a resulting audio signal 116, where the stereo to multichannel upmix 114 is to increase a number of channels associated with the audio signal 104.

At block 906, the method may include in response to a determination that the audio signal 104 includes the second content format 108, routing the audio signal 104 to another low-frequency extension 118 to generate the resulting audio signal 116.

At block 908, the method may include performing spatial synthesis on the resulting audio signal 116.

At block 910, the method may include performing crosstalk cancellation on the spatial synthesized audio signal 104.

At block 912, the method may include performing multiband-range compression on the crosstalk cancelled audio signal 104.

At block 914, the method may include generating an output stereo signal 130 based on the multiband-range compressed audio signal 104.

Referring to FIGS. 1-8 and 10, and particularly FIG. 10, for the block diagram 1000, the non-transitory computer readable medium 1002 may include instructions 1006 to determine whether an audio signal 104 includes a first content format 106 including stereo content, or a second content format 108 including multichannel or object-based content.

The processor 1004 may fetch, decode, and execute the instructions 1008 to in response to a determination that the audio signal 104 includes the first content format 106, route the audio signal 104 to a low-frequency extension 112 and a stereo to multichannel upmix 114 to generate a resulting audio signal 116.

The processor 1004 may fetch, decode, and execute the instructions 1010 to in response to a determination that the audio signal 104 includes the second content format 108, route the audio signal 104 to another low-frequency extension 118 to generate the resulting audio signal 116.

The processor 1004 may fetch, decode, and execute the instructions 1012 to perform spatial synthesis on the resulting audio signal 116.

The processor 1004 may fetch, decode, and execute the instructions 1014 to perform crosstalk cancellation on the spatial synthesized audio signal 104.

The processor 1004 may fetch, decode, and execute the instructions 1016 to perform multiband-range compression on the crosstalk cancelled audio signal 104 by using perfect reconstruction filterbanks.

The processor 1004 may fetch, decode, and execute the instructions 1018 to generate an output stereo signal 130 based on the multiband-range compressed audio signal 104.

What has been described and illustrated herein is an example along with some of its variations. The terms, descriptions and figures used herein are set forth by way of illustration only and are not meant as limitations. Many variations are possible within the spirit and scope of the subject matter, which is intended to be defined by the following claims—and their equivalents—in which all terms are meant in their broadest reasonable sense unless otherwise indicated.

What is claimed is:

1. An apparatus comprising:
   a processor; and
   a non-transitory computer readable medium storing machine readable instructions that when executed by the processor cause the processor to:
   determine whether an audio signal includes a first content format including stereo content, or a second content format including multichannel or object-based content;
   in response to a determination that the audio signal includes the first content format, route the audio signal to a low-frequency extension and a stereo to multichannel upmix to generate a resulting audio signal;
   in response to a determination that the audio signal includes the second content format, route the audio signal to another low-frequency extension to generate the resulting audio signal;
   perform spatial synthesis on the resulting audio signal;
   perform crosstalk cancellation on the spatial synthesized audio signal;
   perform multiband-range compression on the crosstalk cancelled audio signal; and
   generate an output stereo signal based on the multiband-range compressed audio signal.

2. The apparatus according to claim 1, wherein the instructions are further to cause the processor to:
   route the audio signal, in response to the determination that the audio signal includes the first content format, to the low-frequency extension to
   band pass filter non-linear terms in a plurality of filterbanks associated with the low-frequency extension, and
   determine a sum of the band pass filtered non-linear terms to generate low frequencies associated with the audio signal.

3. The apparatus according to claim 1, wherein the instructions are further to cause the processor to:
   route the audio signal, in response to the determination that the audio signal includes the second content format, to the another low-frequency extension to
   band pass filter non-linear terms in a plurality of filterbanks associated with the another low-frequency extension, and
   determine a sum of the band pass filtered non-linear terms to generate low frequencies associated with the audio signal.

4. The apparatus according to claim 1, wherein the instructions are further to cause the processor to:
   route the audio signal, in response to the determination that the audio signal includes the first content format, to the stereo to multichannel upmix to
   increase a number of channels associated with the audio signal.

5. The apparatus according to claim 1, wherein the instructions are further to cause the processor to:
   perform spatial synthesis on the resulting audio signal by applying head-related transfer functions (HRTFs) to render virtual sources associated with the resulting audio signal at specified angles; and
   reduce a number of channels associated with the virtual sources by performing a linear summation operation with respect to each of the channels.

6. The apparatus according to claim 1, wherein the instructions are further to cause the processor to:
   perform crosstalk cancellation on the spatial synthesized audio signal by performing equalization of ipsilateral signals associated with the audio signal and cancellation of contralateral crosstalk associated with the audio signal.

7. The apparatus according to claim 1, wherein the instructions are further to cause the processor to:
   perform multiband-range compression on the crosstalk cancelled audio signal by using perfect reconstruction filterbanks.

8. The apparatus according to claim 1, wherein the instructions are further to cause the processor to:
   perform decorrelation on the spatial synthesized audio signal by implementing complementary filters as a function of z, N, and $\lambda$, where $z=e^{jw}$, $j=sqrt(-1)$, w represents angular frequency, N represents an integer that determines an order of an all-pass filter, and $\lambda$ represents a coefficient, where $|\lambda|<1$.

9. A method comprising:
   determining, by a processor, whether an audio signal includes a first content format including stereo content, or a second content format including multichannel or object-based content;
   in response to a determination that the audio signal includes the first content format, routing the audio signal to a low-frequency extension and a stereo to multichannel upmix to generate a resulting audio signal, wherein the stereo to multichannel upmix is to increase a number of channels associated with the audio signal;

in response to a determination that the audio signal includes the second content format, routing the audio signal to another low-frequency extension to generate the resulting audio signal;

performing spatial synthesis on the resulting audio signal;

performing crosstalk cancellation on the spatial synthesized audio signal;

performing multiband-range compression on the crosstalk cancelled audio signal; and generating an output stereo signal based on the multiband-range compressed audio signal.

10. The method according to claim 9, further comprising:
routing the audio signal, in response to the determination that the audio signal includes the first content format, to the low-frequency extension to
  band pass filter non-linear terms in a plurality of filterbanks associated with the low-frequency extension, and
  determine a sum of the band pass filtered non-linear terms to generate low frequencies associated with the audio signal.

11. The method according to claim 9, further comprising:
routing the audio signal, in response to the determination that the audio signal includes the second content format, to the another low-frequency extension to
  band pass filter non-linear terms in a plurality of filterbanks associated with the another low-frequency extension, and
  determine a sum of the band pass filtered non-linear terms to generate low frequencies associated with the audio signal.

12. A non-transitory computer readable medium having stored thereon machine readable instructions, the machine readable instructions, when executed, cause a processor to:
  determine whether an audio signal includes a first content format including stereo content, or a second content format including multichannel or object-based content;
  in response to a determination that the audio signal includes the first content format, route the audio signal to a low-frequency extension and a stereo to multichannel upmix to generate a resulting audio signal;
  in response to a determination that the audio signal includes the second content format, route the audio signal to another low-frequency extension to generate the resulting audio signal;
  perform spatial synthesis on the resulting audio signal;
  perform crosstalk cancellation on the spatial synthesized audio signal;
  perform multiband-range compression on the crosstalk cancelled audio signal by using perfect reconstruction filterbanks; and
  generate an output stereo signal based on the multiband-range compressed audio signal.

13. The non-transitory computer readable medium according to claim 12, wherein the instructions are further to cause the processor to:
  route the audio signal, in response to the determination that the audio signal includes the first content format, to the stereo to multichannel upmix to
    increase a number of channels associated with the audio signal.

14. The non-transitory computer readable medium according to claim 12, wherein the instructions are further to cause the processor to:
  perform spatial synthesis on the resulting audio signal by applying head-related transfer functions (HRTFs) to render virtual sources associated with the resulting audio signal at specified angles; and
  reduce a number of channels associated with the virtual sources by performing a linear summation operation with respect to each of the channels.

15. The non-transitory computer readable medium according to claim 12, wherein the instructions are further to cause the processor to:
  perform decorrelation on the spatial synthesized audio signal by implementing complementary filters as a function of z, N, and $\lambda$, where $z=e^{jw}$, $j=\sqrt{-1}$, w represents angular frequency, N represents an integer that determines an order of an all-pass filter, and $\lambda$ represents a coefficient, where $|\lambda|<1$.

* * * * *